(12) United States Patent
Uenoyama et al.

(10) Patent No.: US 11,976,968 B2
(45) Date of Patent: May 7, 2024

(54) LIGHT DETECTOR

(71) Applicant: HAMAMATSU PHOTONICS K.K., Hamamatsu (JP)

(72) Inventors: Soh Uenoyama, Hamamatsu (JP); Takuya Hashimoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 18/139,426

(22) Filed: Apr. 26, 2023

(65) Prior Publication Data

US 2023/0358606 A1 Nov. 9, 2023

(30) Foreign Application Priority Data

May 9, 2022 (JP) .................... 2022-077091

(51) Int. Cl.
*G01J 1/44* (2006.01)
*G01J 1/04* (2006.01)

(52) U.S. Cl.
CPC ............... *G01J 1/44* (2013.01); *G01J 1/0411* (2013.01); *G01J 2001/4466* (2013.01)

(58) Field of Classification Search
CPC .......... G01J 1/04; G01J 1/0407; G01J 1/0411; G01J 2001/4446; G01J 2001/446; G01J 2001/4466

See application file for complete search history.

(56) References Cited

U.S. PATENT DOCUMENTS

| | | | | |
|---|---|---|---|---|
| 11,092,717 | B2* | 8/2021 | Capasso | G02B 1/002 |
| 11,391,774 | B2* | 7/2022 | Uenoyama | G02B 21/365 |
| 2022/0155504 | A1* | 5/2022 | Hsieh | H01L 27/14625 |
| 2022/0221705 | A1* | 7/2022 | Uenoyama | G01N 21/3563 |
| 2023/0221416 | A1* | 7/2023 | Park | G01S 7/4817 |
| | | | | 356/4.01 |

OTHER PUBLICATIONS

West, Paul R. et al., "All-dielectric subwavelength metasurface focusing lens," Optics Express, vol. 22, No. 21, Oct. 17, 2014, pp. 26212-26221.

* cited by examiner

*Primary Examiner* — John R Lee
(74) *Attorney, Agent, or Firm* — Faegre Drinker Biddle & Reath LLP

(57) ABSTRACT

The light detector includes a light detection substrate having at least one light receiving region and a light incident surface on which a detection target light is incident, and a meta-lens including a plurality of unit structures arranged in a grid pattern and disposed on the light incident surface to focus the detection target light. When viewed in a thickness direction of the light detection substrate, an opening region in which no unit structure is formed is provided in a region including a center of the meta-lens.

9 Claims, 20 Drawing Sheets

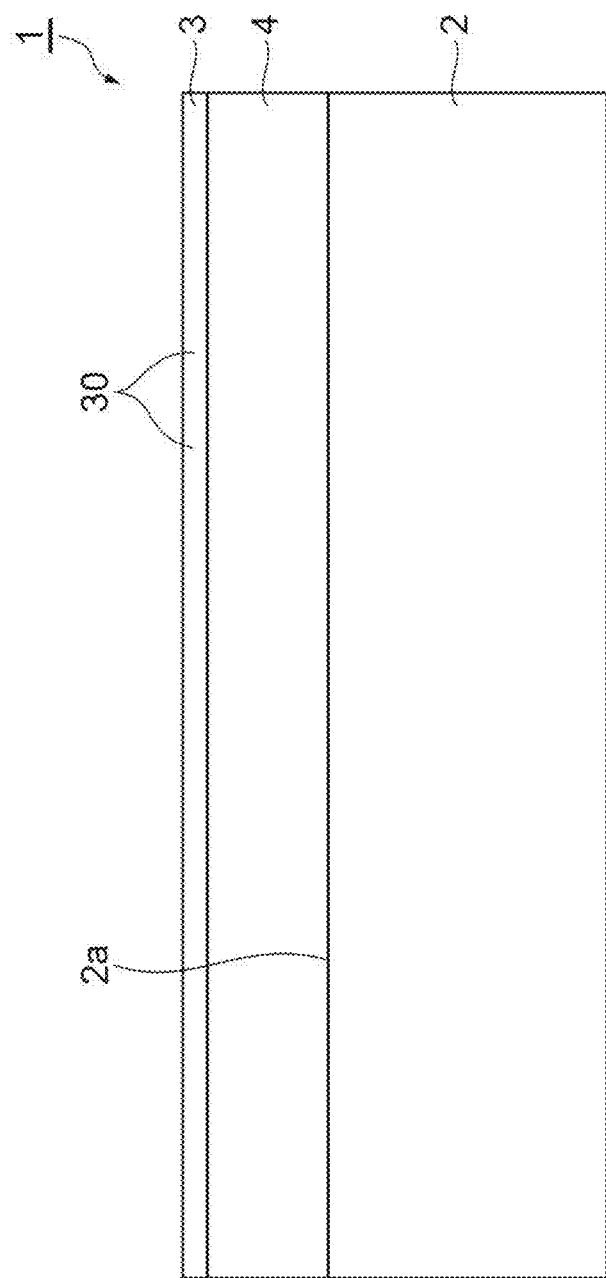
Fig.1
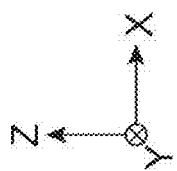

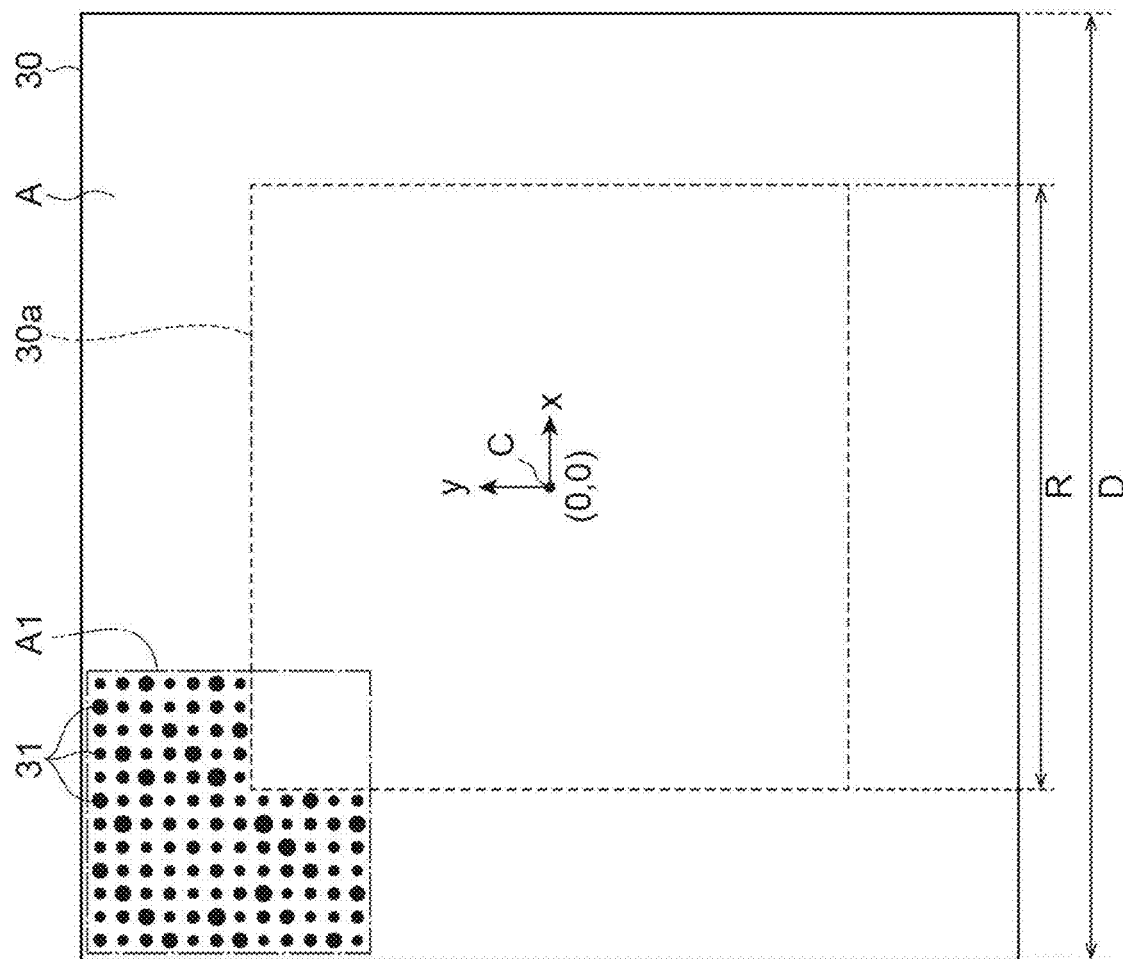
Fig.8
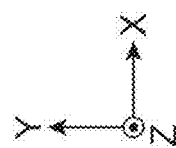

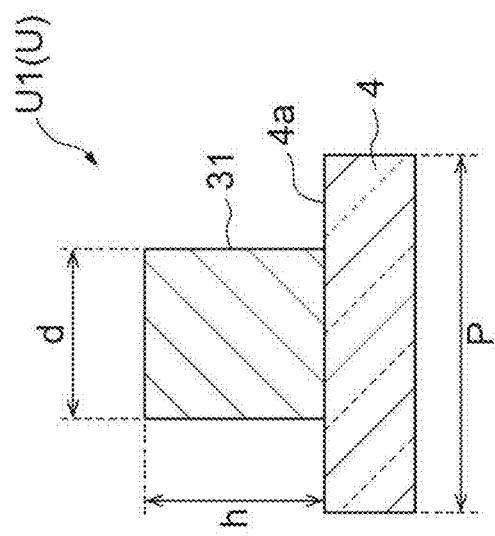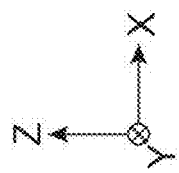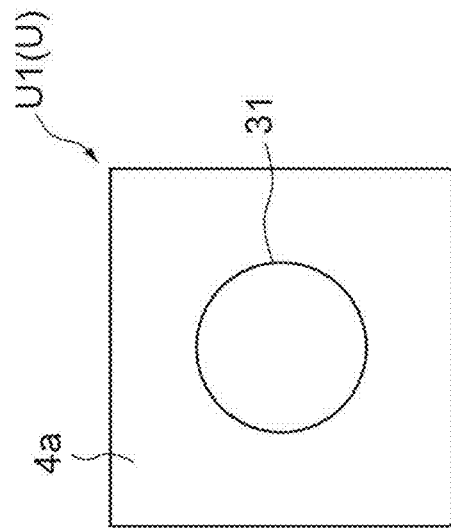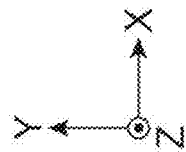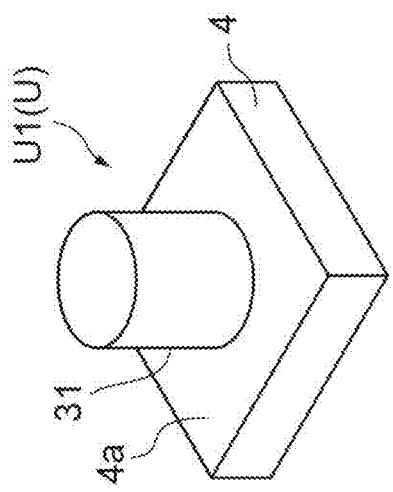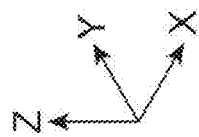

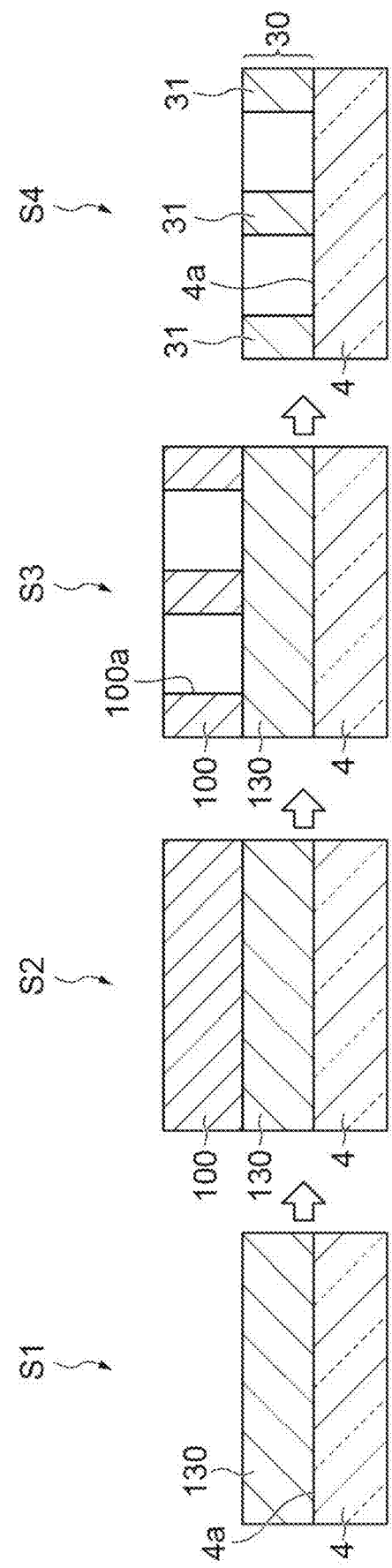

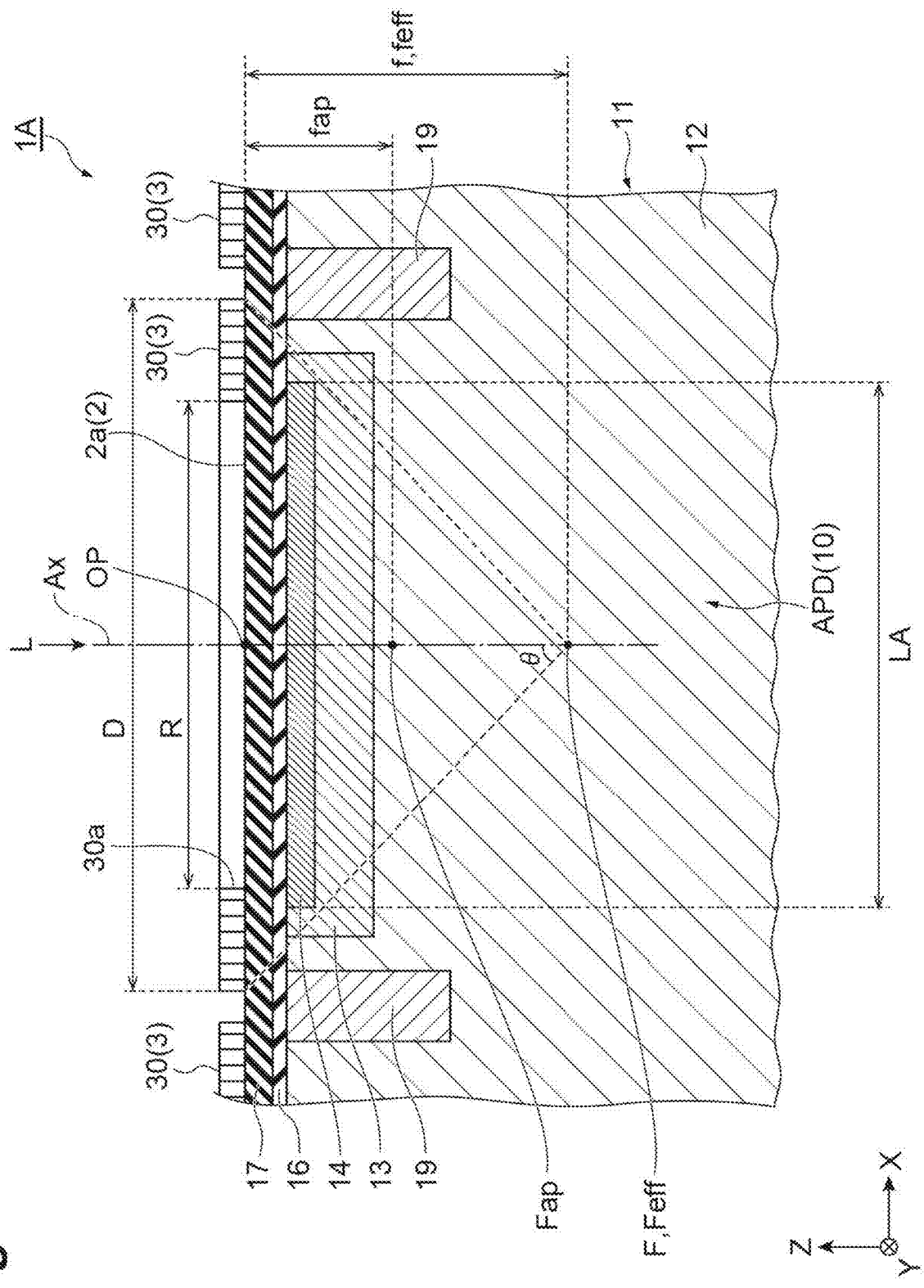

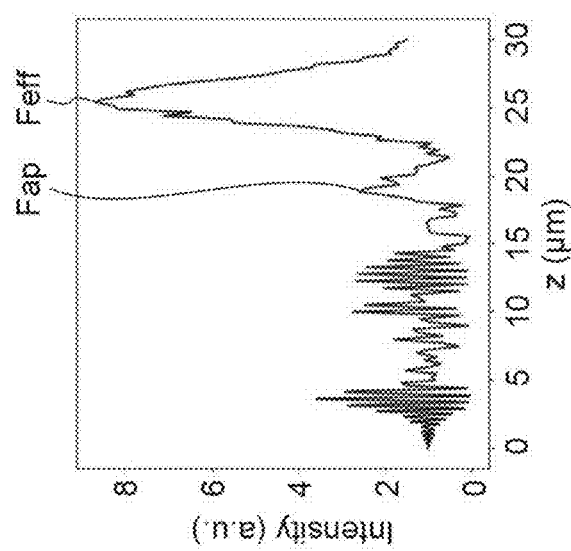
Fig.20C
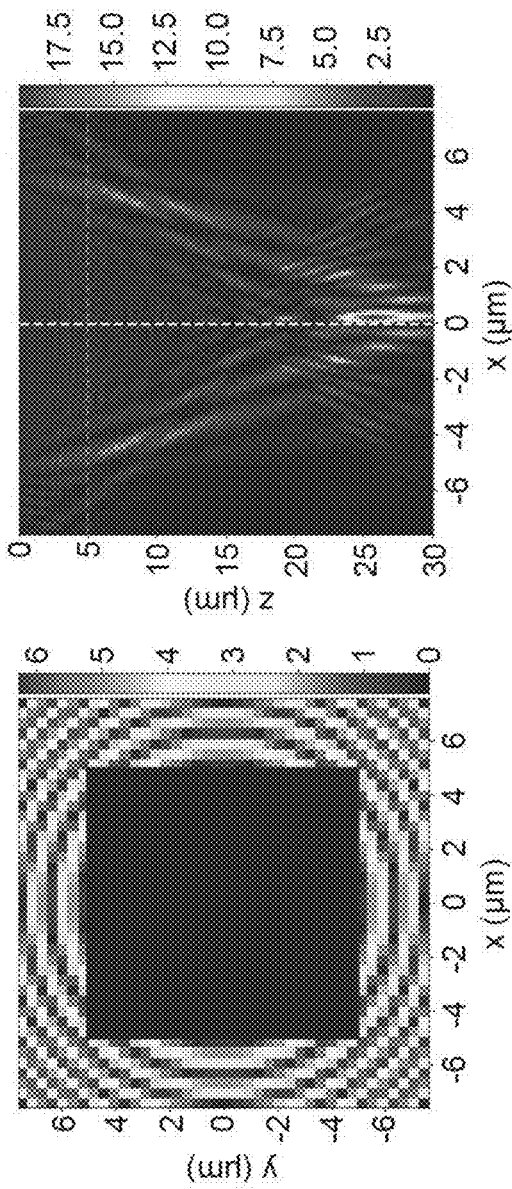
Fig.20B
Fig.20A

LIGHT DETECTOR

TECHNICAL FIELD

The present disclosure relates to a light detector.

CROSS-REFERENCE TO RELATED APPLICATION

This application claims the benefit of priority from Japanese Patent Application No. 2022-077091, filed on May 9, 2022, the entire contents of which are incorporated herein by reference.

BACKGROUND

Conventionally, as disclosed in Non-Patent Document 1 (Paul R. West, James L. Stewart, Alexander V. Kildishev, Vladimir M. Shalaev, Vladimir V. Shkunov, Friedrich Strohkendl, Yuri A. Zakharenkov, Robert K. Dodds, and Robert Byren, "All-dielectric subwavelength metasurface focusing lens", Vol. 22, No. 21, OPTICS EXPRESS pp. 26212 to 26221, 17 Oct. 2014), a meta-lens configured by a plurality of fine unit structures (pillars) arranged in a grid pattern is known.

SUMMARY

The above-described meta-lens may be disposed on a light incident surface of a light detector in order to increase light receiving sensitivity of the light detector, for example. By disposing the meta-lens on the surface of the light detector, it can be expected that the detection target light is efficiently focused on the light receiving region (effective sensitivity region). By the way, from the viewpoint of effectively increasing the light receiving sensitivity of the light detector, there is a case where it is desired to focus the detection target light on a position as shallow as possible (a position close to the front surface) of a light detection substrate (silicon substrate or the like) included in the light detector. However, in the case of using the conventional meta-lens as disclosed in Non-Patent Document 1, the focal length can be shortened only within a range that can be achieved by phase design under a structural constraint that the meta-lens is configured by a periodic structure of a plurality of unit structures.

Accordingly, it is an object of an aspect of the present disclosure to provide a light detector capable of focusing light on a position closer to a light incident surface than a focus point based on a phase design of a meta-lens.

The present disclosure includes the following light detectors [1] to [10].

[1] A light detector including: a light detection substrate having at least one light receiving region and a light incident surface on which a detection target light is incident; and a meta-lens configured by a plurality of unit structures arranged in a grid pattern and disposed on the light incident surface to focus the detection target light, wherein when viewed in a thickness direction of the light detection substrate, an opening region in which the unit structure is not formed is provided in a region including a center of the meta-lens.

According to the light detector, it is possible to simultaneously generate diffraction by a meta-lens (a plurality of unit structures) and diffraction by an opening region (opening diffraction). By simultaneously generating two types of diffraction in this manner, it is possible to form a light-condensing point at a position closer to the light incident surface than a focus point in a case where only diffraction by the meta-lens occurs (that is, a focus point set by a plurality of unit structures constituting the meta-lens). That is, according to the light detector, by providing the opening region, it is possible to focus light on a position closer to the light incident surface than the focus point based on the phase design of the meta-lens.

[2] The light detector according to [1], further including: a dielectric layer disposed between the light detection substrate and the meta-lens, and having a refractive index lower than that of the light detection substrate. According to the light detector, it is possible to improve a light collection effect on a light-condensing point formed at a position closer to the light incident surface than the focus point based on the phase design of the meta-lens.

[3] The light detector according to [1] or [2], wherein a numerical aperture NA of the meta-lens is set so as to satisfy the following Equation (1), and in the Equation (1), $\lambda_{\it eff}$ is an effective wavelength of the detection target light passing through the meta-lens, and P is a period in which the plurality of unit structures are arranged. According to the light detector, it is possible to more reliably form the light-condensing point at a position closer to the light incident surface than the focus point based on the phase design of the meta-lens.

$$\frac{\lambda_{\it eff}}{4*P} < NA < \frac{\lambda_{\it eff}}{2*P} \quad (1)$$

[4] The light detector according to any one of [1] to [3], wherein when viewed in the thickness direction, the opening region has a rectangular shape. According to the light detector, compared to a case where the opening region has a shape (for example, a circular shape) other than a rectangular shape, it is possible to improve a light collection effect on a light-condensing point formed at a position closer to the light incident surface than the focus point based on the phase design of the meta-lens.

[5] The light detector according to any one of [1] to [4], wherein the plurality of unit structures are configured such that a phase distribution of the meta-lens follows a quadratic phase pattern. According to the light detector, compared to a case where a pattern (for example, a Fresnel pattern) other than the secondary phase pattern is applied to the phase distribution of the meta-lens, it is possible to improve a light collection effect on a light-condensing point formed at a position closer to the light incident surface than the focus point based on the phase design of the meta-lens.

[6] The light detector according to any one of [1] to [5], wherein the light detection substrate includes an avalanche photodiode. According to the above-described light detector, the light-condensing point is formed at a position closer to the light incident surface than the focus point based on the phase design of the meta-lens (that is, a position as close as possible to the interface of the PN junction), and thus it is possible to effectively improve the light receiving sensitivity of the avalanche photodiode.

[7] The light detector according to any one of [1] to [6], wherein when viewed in the thickness direction, the meta-lens is formed to overlap both an adjacent region adjacent to the light receiving region and a peripheral region inside of the light receiving region along a boundary between the light receiving region and the adjacent region. According to the light detector, even when the light receiving region is small, a meta-lens (unit structure) is formed in a portion overlapping both the adjacent region and the peripheral region, such that the detection target light may be reliably focused on the light receiving region.

[8] The light detector according to any one of [1] to [7], wherein the meta-lens is formed such that a first distance is 40% or more and 90% or less of a second distance, and the second distance is a distance in the thickness direction from the meta-lens to a focus point set by the meta-lens, and the first distance is a distance in the thickness direction from the meta-lens to a light-condensing point formed at a position closer to the light incident surface than the focus point due to the opening region being provided.

[9] The light detector according to [8], wherein the meta-lens is formed such that the first distance is not less than 50% and not more than 80% of the second distance.

[10] The light detector according to any one of [1] to [9], wherein when viewed in the thickness direction, a width of the opening region is equal to or greater than a half of a width of the meta-lens. According to the above light detector, by making the width of the opening region sufficiently larger than the width of the meta-lens, it is possible to more reliably form the light-condensing point at a position closer to the light incident surface than the focus point based on the phase design of the meta-lens.

According to an aspect of the present disclosure, it is possible to provide a light detector capable of condensing light at a position closer to a light incident surface than a focus point based on a phase design of a meta-lens.

BRIEF DESCRIPTION OF THE DRAWINGS

FIG. 1 is a diagram schematically illustrating a stacked structure of a light detector according to an embodiment.

FIG. 8 is a schematic plan view of the meta-lens shown in FIG. 7.

Each of FIGS. 10A to 10 C is a diagram illustrating an example of a meta-lens unit structure.

FIG. 11 is a diagram illustrating an example of a manufacturing process of a meta-lens.

Figure 12C:
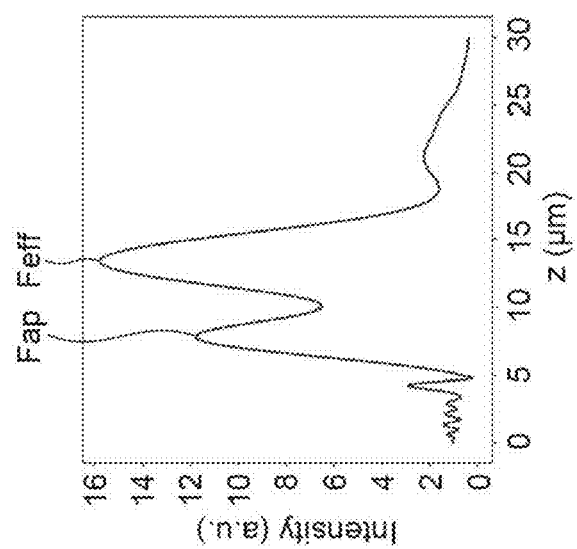
Figure 12B:
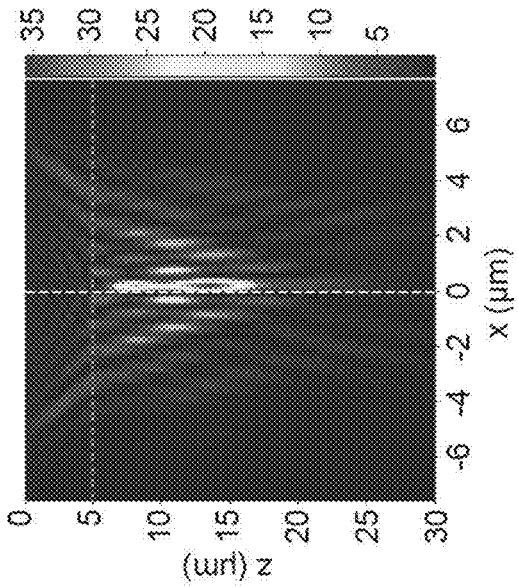
Figure 12A:
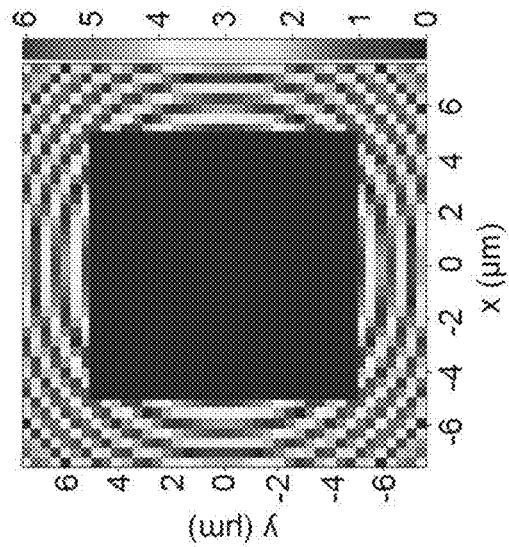

FIGS. 12A to 12C illustrate simulation results of a meta-lens phase pattern and light intensity distribution of a first example light detector.

Figure 13C:
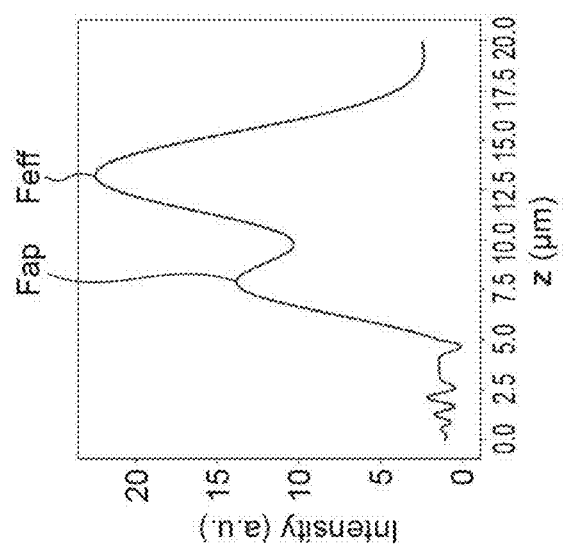
Figure 13B:
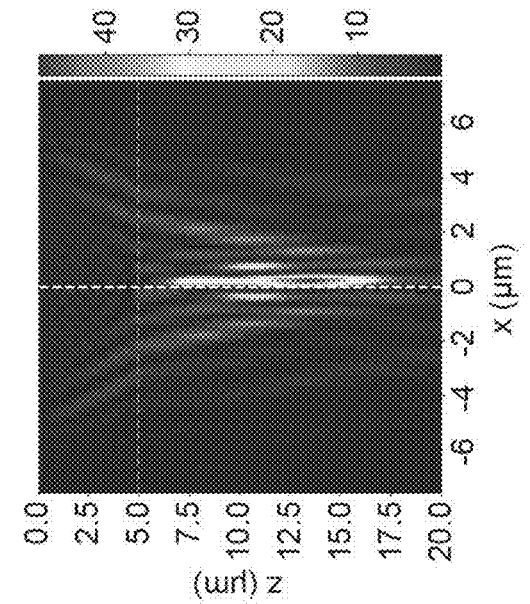
Figure 13A:
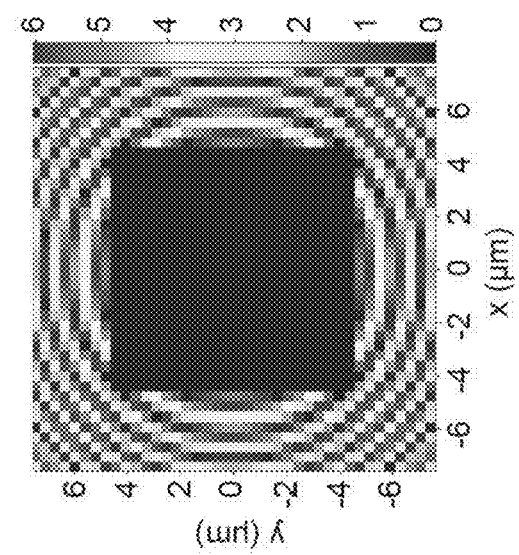

FIGS. 13A to 13C illustrate simulation results of a meta-lens phase pattern and light intensity distribution of a second example light detector.

Figure 14C:
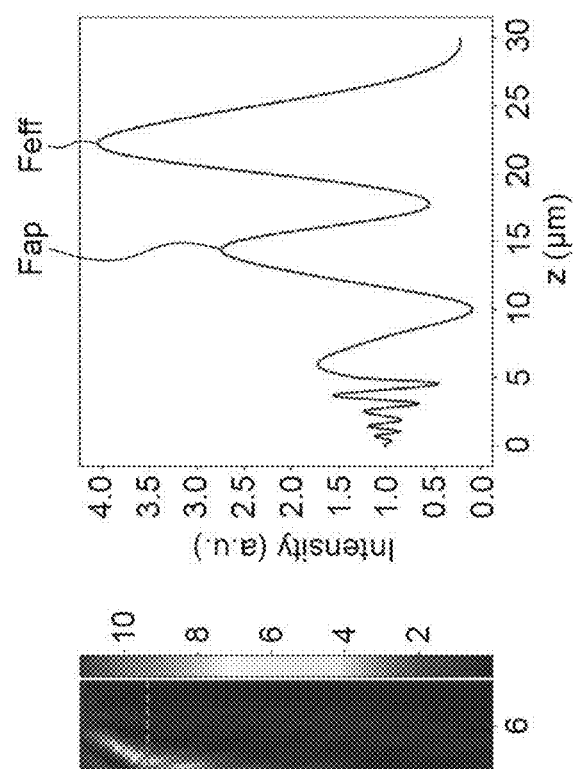
Figure 14B:
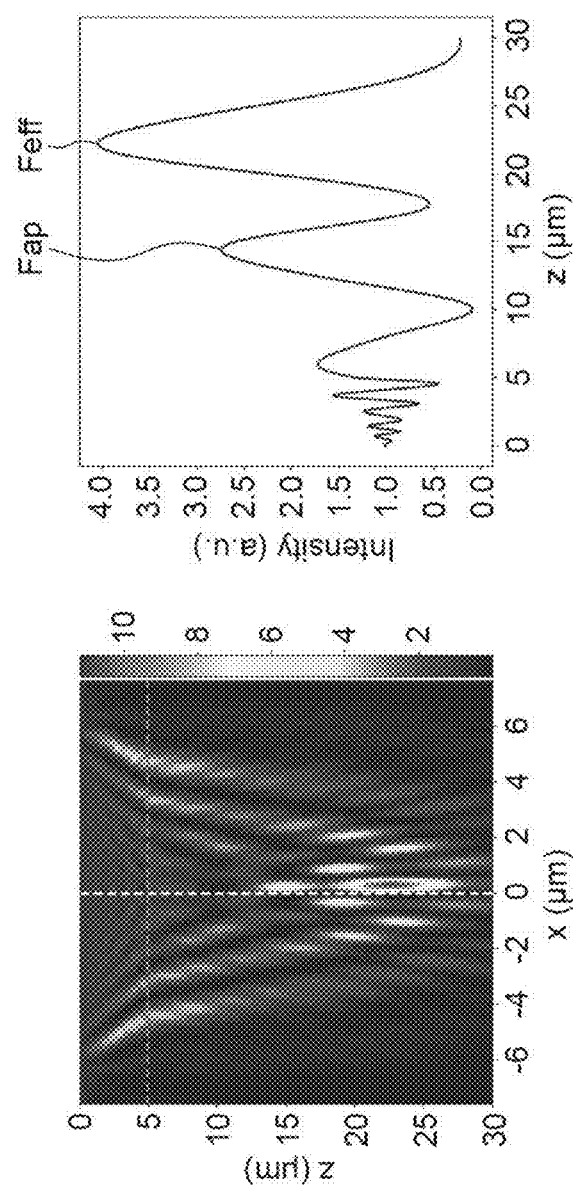
Figure 14A:
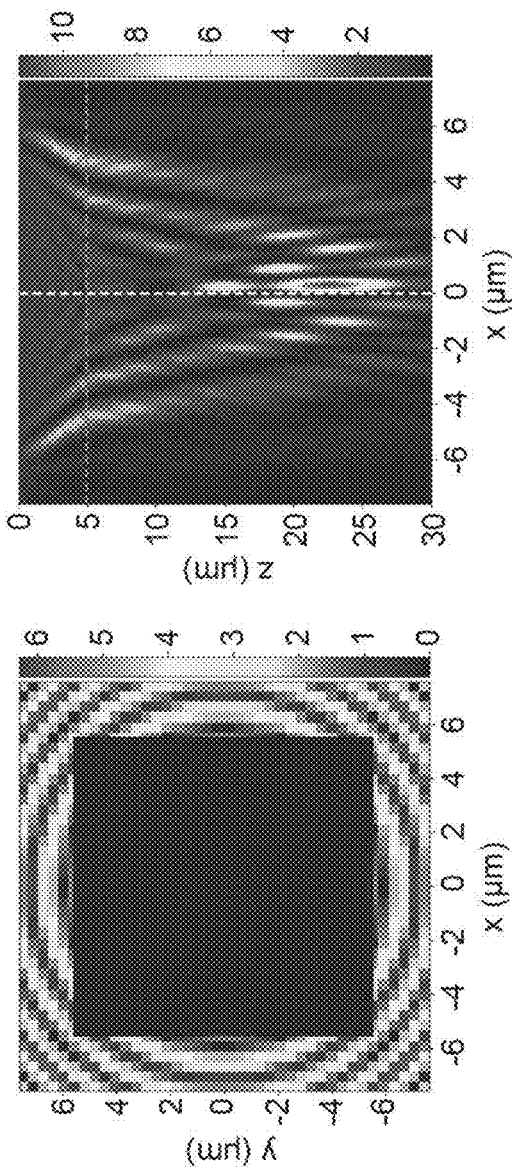

FIGS. 14A to 14C illustrate simulation results of a meta-lens phase pattern and light intensity distribution of a third example light detector.

Figure 15A:
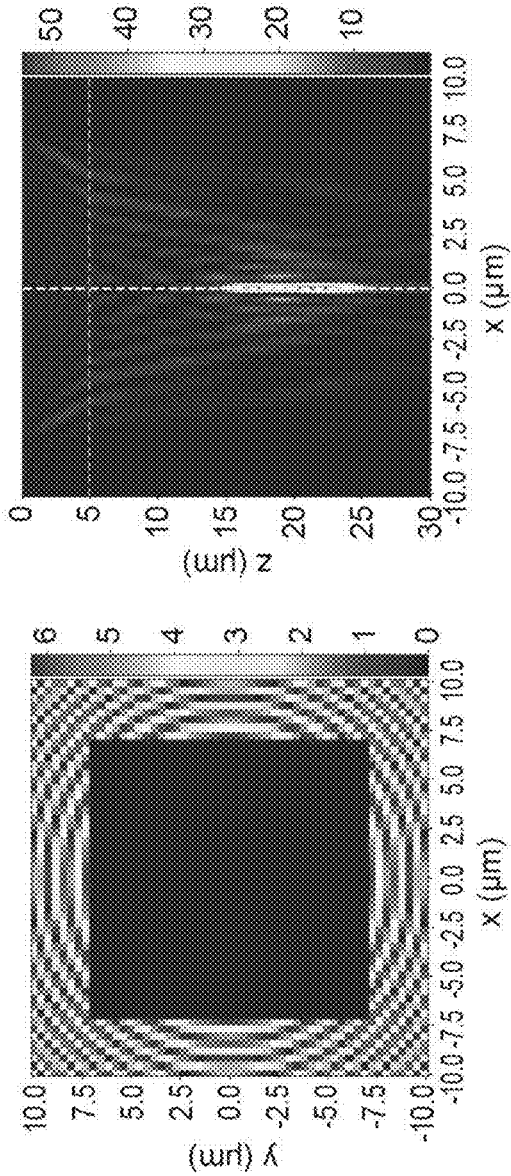
Figure 15B:
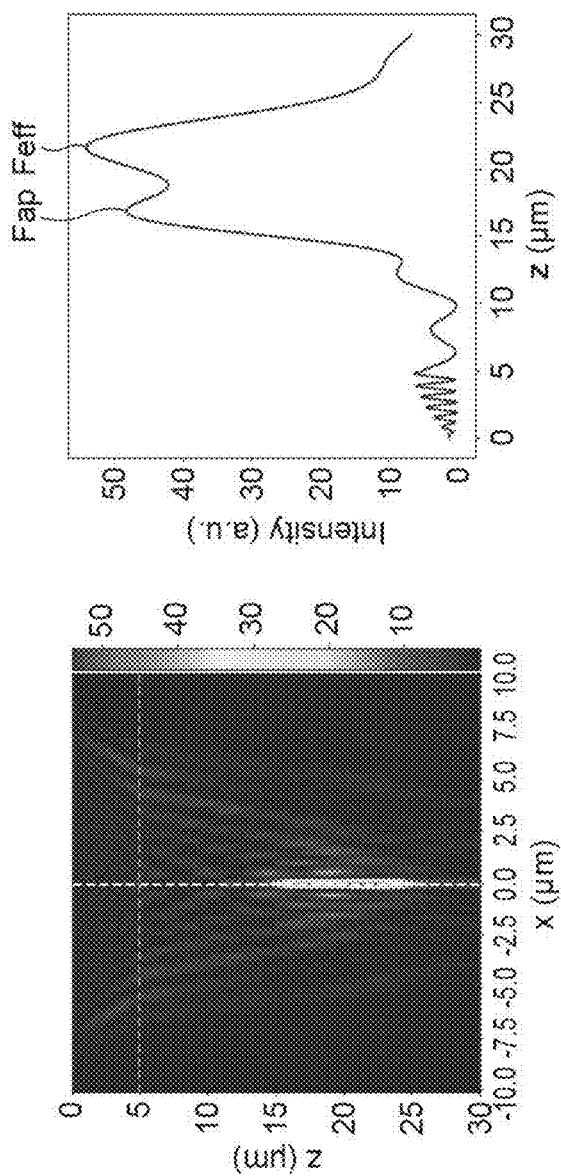
Figure 15C:
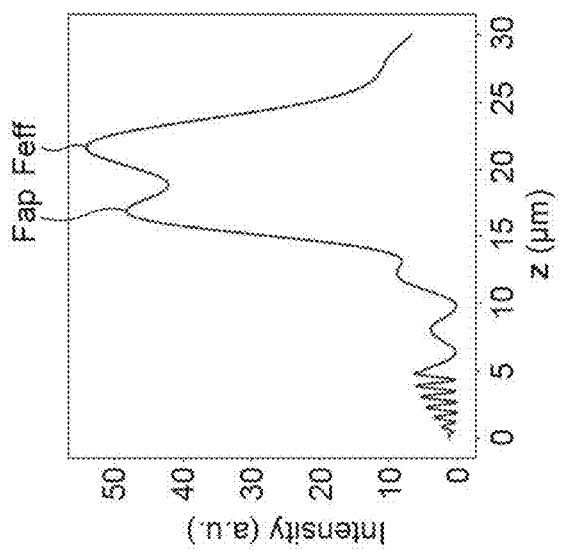

FIGS. 15A to 15C illustrate simulation results of a meta-lens phase pattern and light intensity distribution of a fourth example light detector.

Figure 16C:
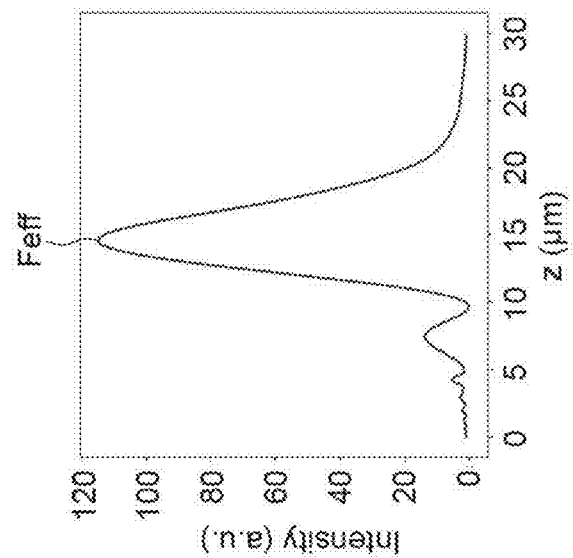
Figure 16B:
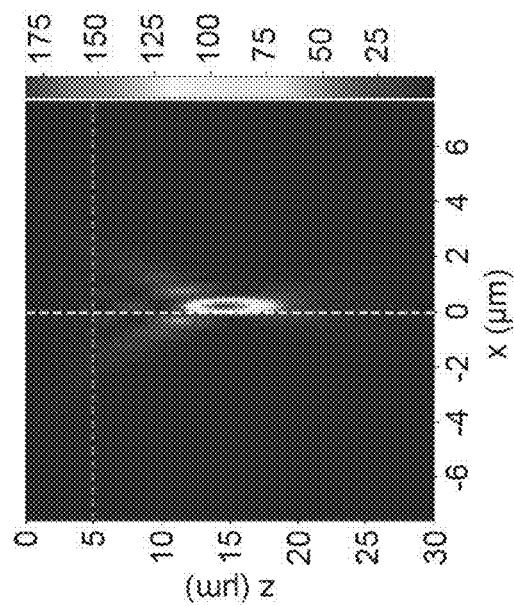
Figure 16A:
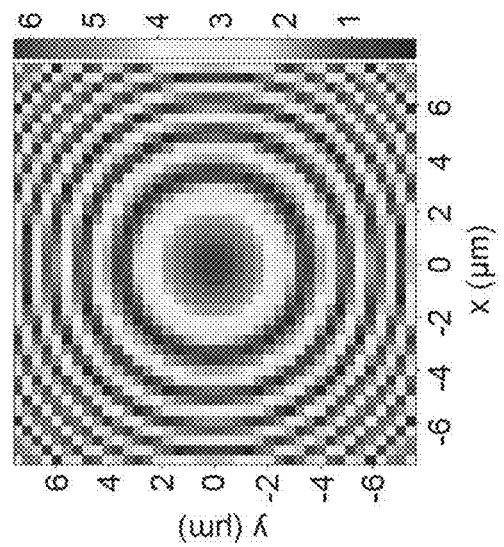

FIGS. 16A to 16C illustrate simulation results of a meta-lens phase pattern and light intensity distribution of a light detector of a comparative example.

Figure 17A:
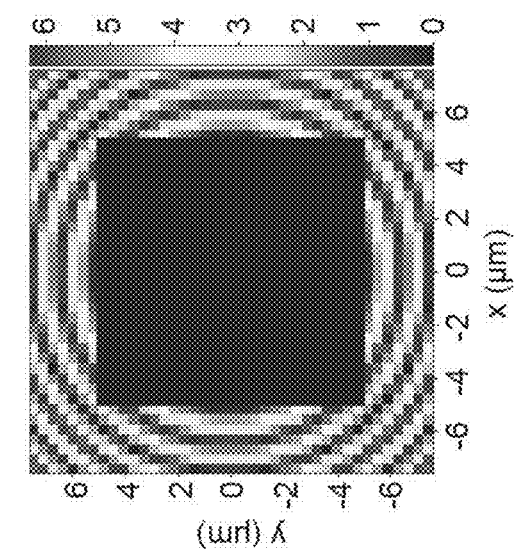
Figure 17B:
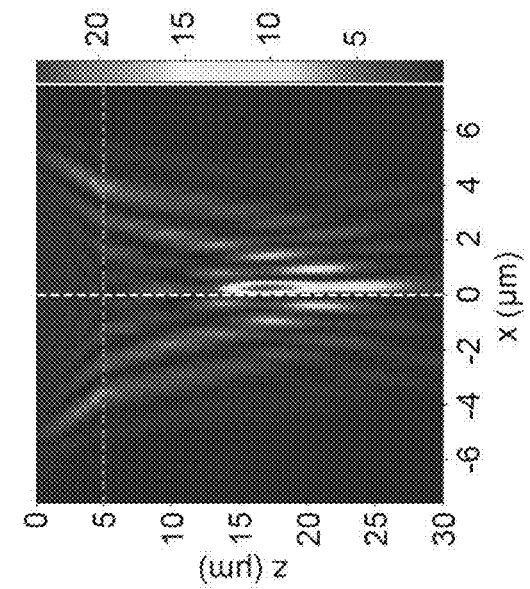
Figure 17C:
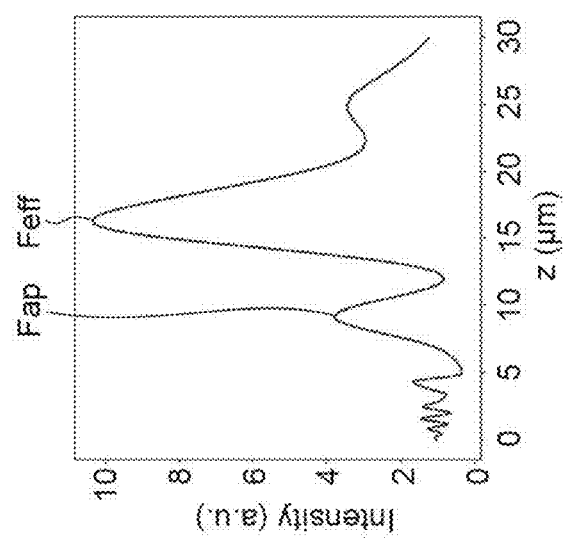

FIGS. 17A to 17C illustrate simulation results of a meta-lens phase pattern and light intensity distribution of a light detector of a first modification example.

Figure 18C:
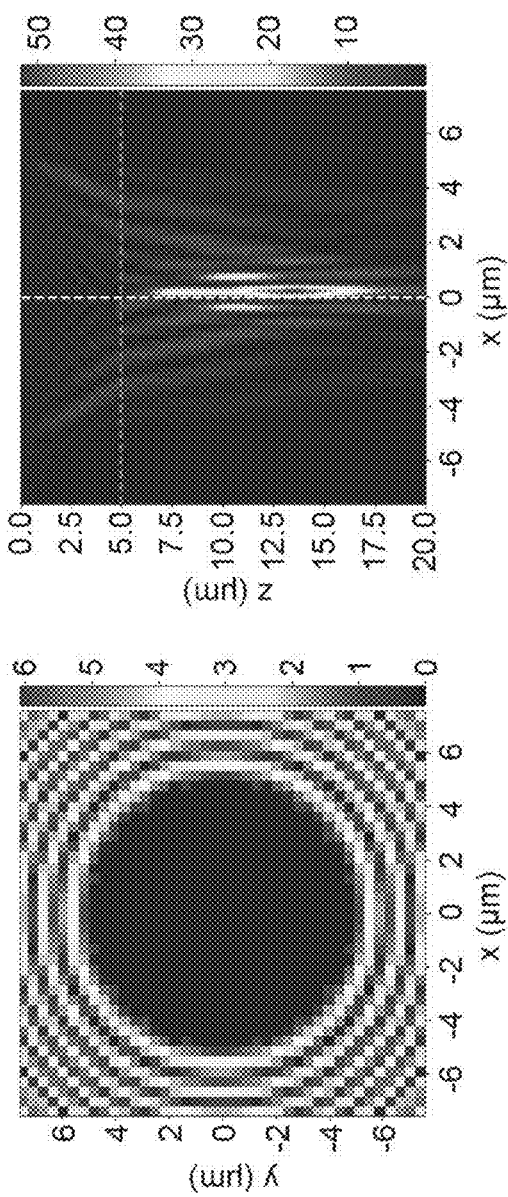
Figure 18B:
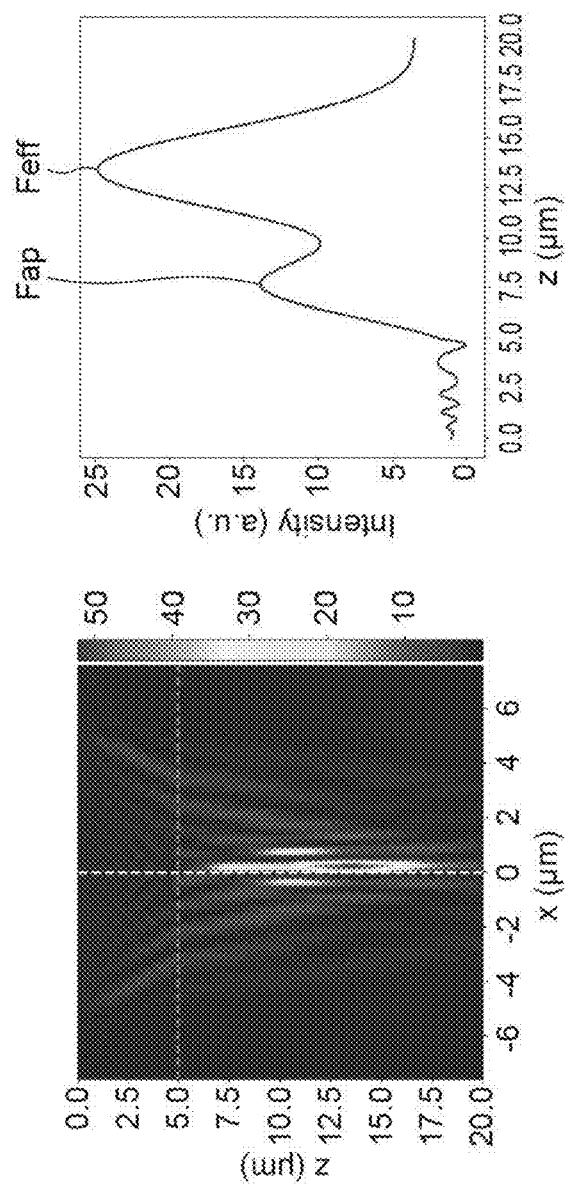
Figure 18A:
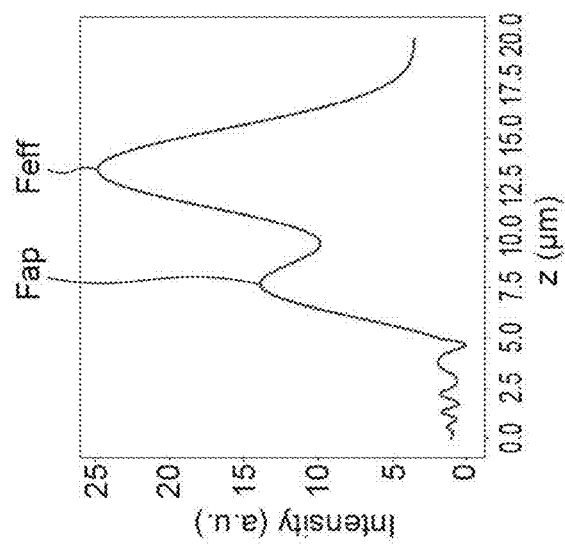

FIGS. 18A to 18C illustrate simulation results of a meta-lens phase pattern and light intensity distribution of a light detector of a second modification example.

FIG. 19 is a cross-sectional view of a portion corresponding to one light detection unit of the light detector of a third modification example.

FIGS. 20A to 20C illustrate simulation results of a meta-lens phase pattern and light intensity distribution of a light detector of the third modification example.

DETAILED DESCRIPTION

Hereinafter, an embodiment of the present invention will be described in detail with reference to the drawings. In the following description, the same or corresponding elements are denoted by the same reference signs, and redundant description will be omitted.

Figure 2:
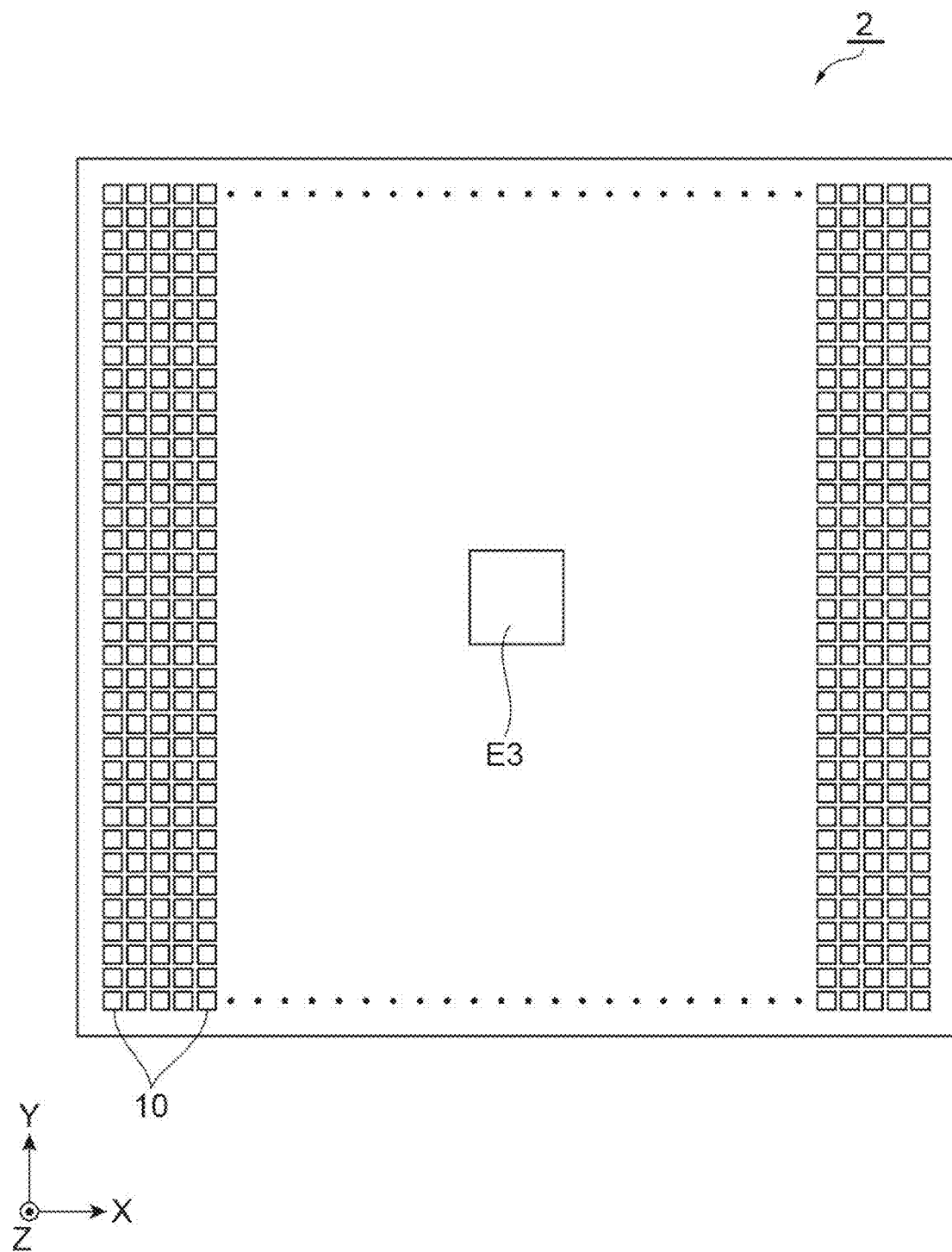
FIG. 2 is a schematic plan view of the light detection substrate shown in FIG. 1.

As shown in FIG. 1, the light detector 1 includes a light detection substrate 2, a lens layer 3, and a dielectric layer 4. As shown in FIG. 2, the light detector 1 includes a plurality of light detection units 10 arranged two dimensionally and a common electrode E3. The plurality of light detection units 10 are arranged in a matrix shape. The lens layer 3 includes a plurality of meta-lenses 30 respectively corresponding to the plurality of light detection units 10. The dielectric layer 4 is arranged between the light detection substrate 2 and the lens layer 3 (meta-lenses 30). For convenience of description, some drawings show three dimensional orthogonal coordinates including an X axis, a Y axis, and a Z axis. The X-axis direction and the Y-axis direction correspond to a row direction and a column direction in which the plurality of light detection units 10 are arranged. The Z-axis direction is a direction perpendicular to the X-axis direction and the Y-axis direction, and corresponds to the thickness direction of the light detection substrate 2.

The light detection substrate 2 has a plurality of light receiving regions LA (see FIG. 7) and a light incident surface 2a on which the detection target light L (see FIG. 7) is incident. One light receiving region LA is provided for one light detection unit 10. The detection target light L is light to be detected by the light detector 1. As an example, the waveband of the detection target light L is included in the range of 300 nm to 6 μm.

As illustrated in FIG. 2, the light detection substrate 2 has, for example, a rectangular shape when viewed in the Z-axis direction. The common electrode E3 is located at the center of the light detection substrate 2 when viewed in the Z-axis direction. Electric charges generated in each light detection unit 10 are collected in the common electrode E3. That is, the light detection substrate 2 is a silicon photomultiplier (SiPM) including a plurality of single photon avalanche diodes (SPAD) (light detection units 10). Note that, in FIG. 2, only some of the light detection units 10 arranged in regions at both ends of the light detection substrate 2 in the X-axis direction are illustrated, but the plurality of light detection units 10 are formed in the entire region of the light detection substrate 2 excluding the common electrode E3. As an example, the light detection unit 10 has a rectangular shape when viewed in the Z-axis direction. However, the shape of the light detection unit 10 when viewed in the Z-axis direction may be a shape other than the rectangular shape (for example, a circular shape).

Figure 3:
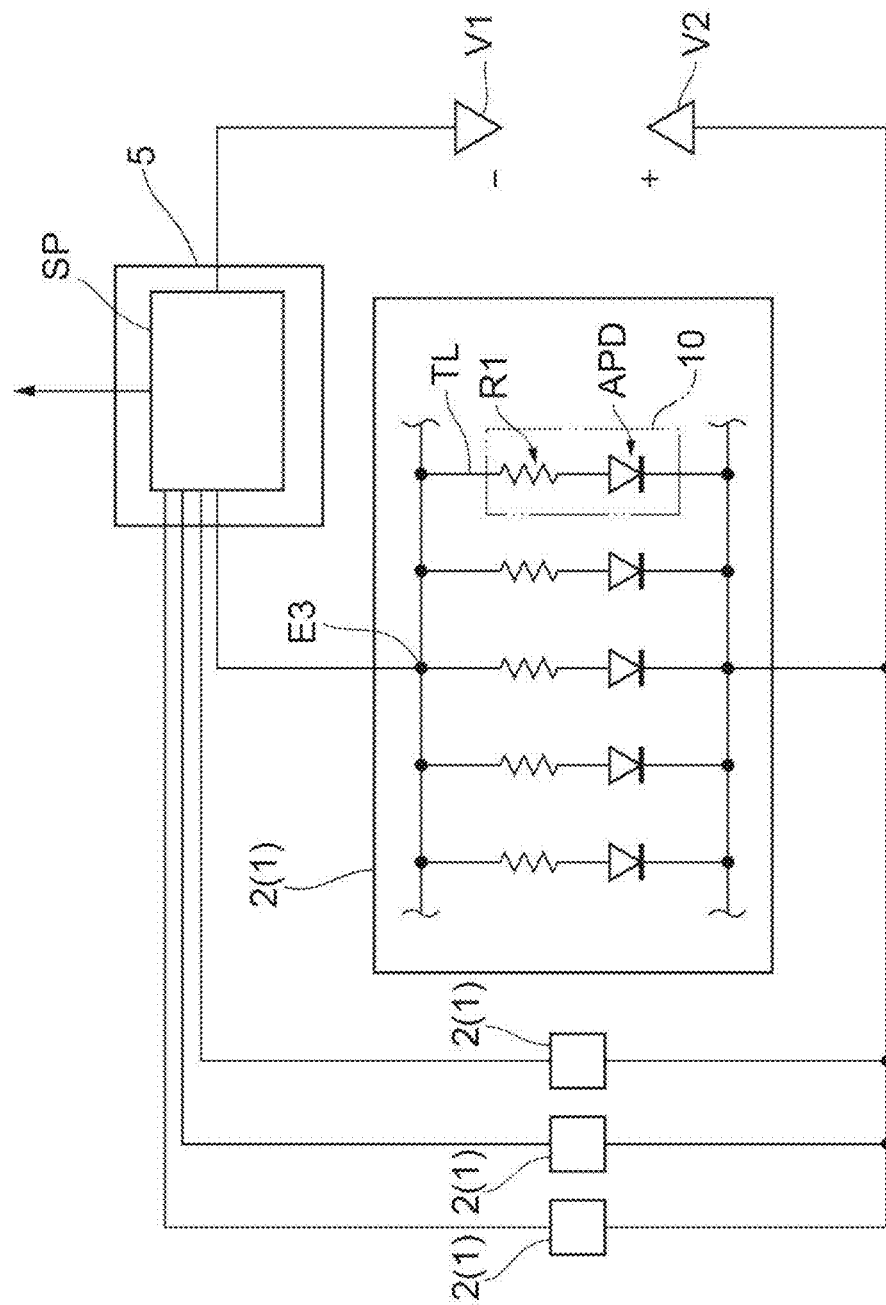
FIG. 3 is a circuit diagram of the light detector shown in FIG. 1.

As illustrated in FIG. 3, in the present embodiment, as an example, a wiring substrate 5 that performs signal processes is shared by a plurality of light detectors 1 (light detection substrates 2). In each light detection substrate 2, each light detection unit 10 includes an avalanche photodiode APD and a quenching resistor R1. That is, the light detection substrate 2 includes avalanche photodiodes APD. One end of the quenching resistor R1 is electrically connected to the anode of the avalanche photodiode APD. The other end of the quenching resistor R1 is electrically connected to the common electrode E3 via a readout wiring TL included in the light detection substrate 2. That is, the plurality of light detection units 10 are connected each other in parallel, and in each light detection unit 10, the avalanche photodiode APD and the quenching resistor R1 are directly connected to each other. In the light detection substrate 2, the avalanche photodiode APD is operated in Geiger mode. In the Geiger mode, a reverse voltage (a reverse bias voltage) higher than a breakdown voltage of the avalanche photodiode APD is applied to the avalanche photodiode APD. That is, a potential V1 is applied to the anode of the avalanche photodiode APD, and a potential V2 which is positive with respect to the potential V1 is applied to the cathode of the avalanche photodiode APD. The polarities of these potentials are relative. For example, one of the potentials may be a ground potential.

The wiring substrate 5 is provided with a signal processing unit SP. The signal processing unit SP processes a signal output from each light detection substrate 2 using each light detection substrate 2 as a channel. The signal processing unit SP constitutes, for example, an application specific integrated circuit (ASIC). The signal processing unit SP may include a CMOS circuit that converts a signal output from each light detection substrate 2 into a digital pulse.

Figure 4:
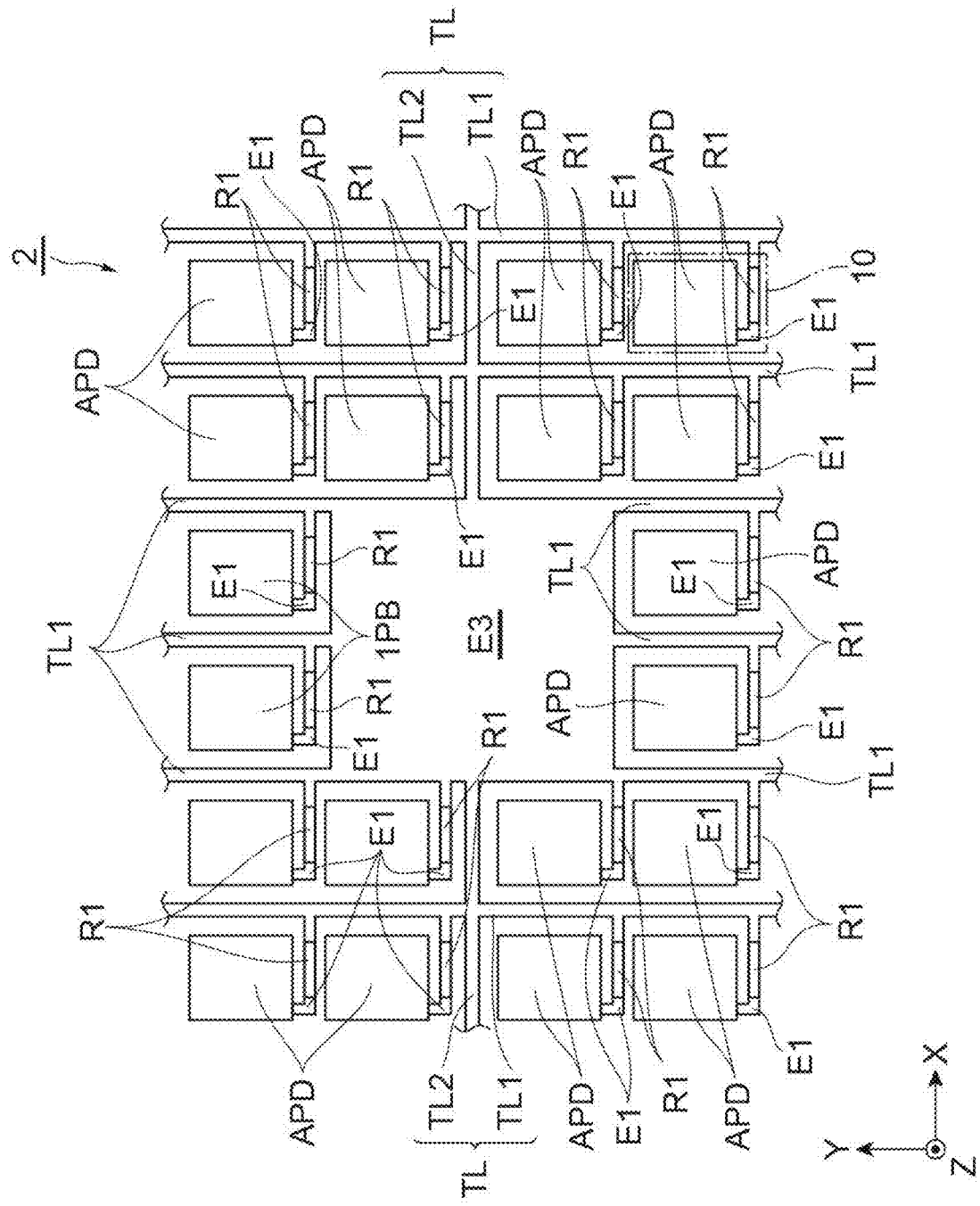
FIG. 4 is a plan view of a portion of the light detection substrate shown in FIG. 1.

As illustrated in FIG. 4, in the light detection substrate 2, the readout wiring TL includes a plurality of signal lines TL1 and a plurality of signal lines TL2. As an example, each signal line TL1 extends in the Y-axis direction between the avalanche photodiodes APD adjacent in the X-axis direction. Each signal line TL2 extends in the X-axis direction between the avalanche photodiodes APD adjacent in the Y-axis direction. The plurality of signal lines TL1 and the plurality of signal lines TL2 extend in a grid pattern so as to be connected to each other at intersection points, and are electrically connected to the common electrode E3.

In each light detection unit 10, one end of the quenching resistor R1 is connected to an electrode E1, and the other end of the quenching resistor R1 is connected to the signal line TL1. That is, in each light detection unit 10, one end of the quenching resistor R1 is electrically connected to the anode of the avalanche photodiode APD via the electrode E1, and the other end of the quenching resistor R1 is electrically connected to the common electrode E3 via the readout wiring TL.

Figure 5:
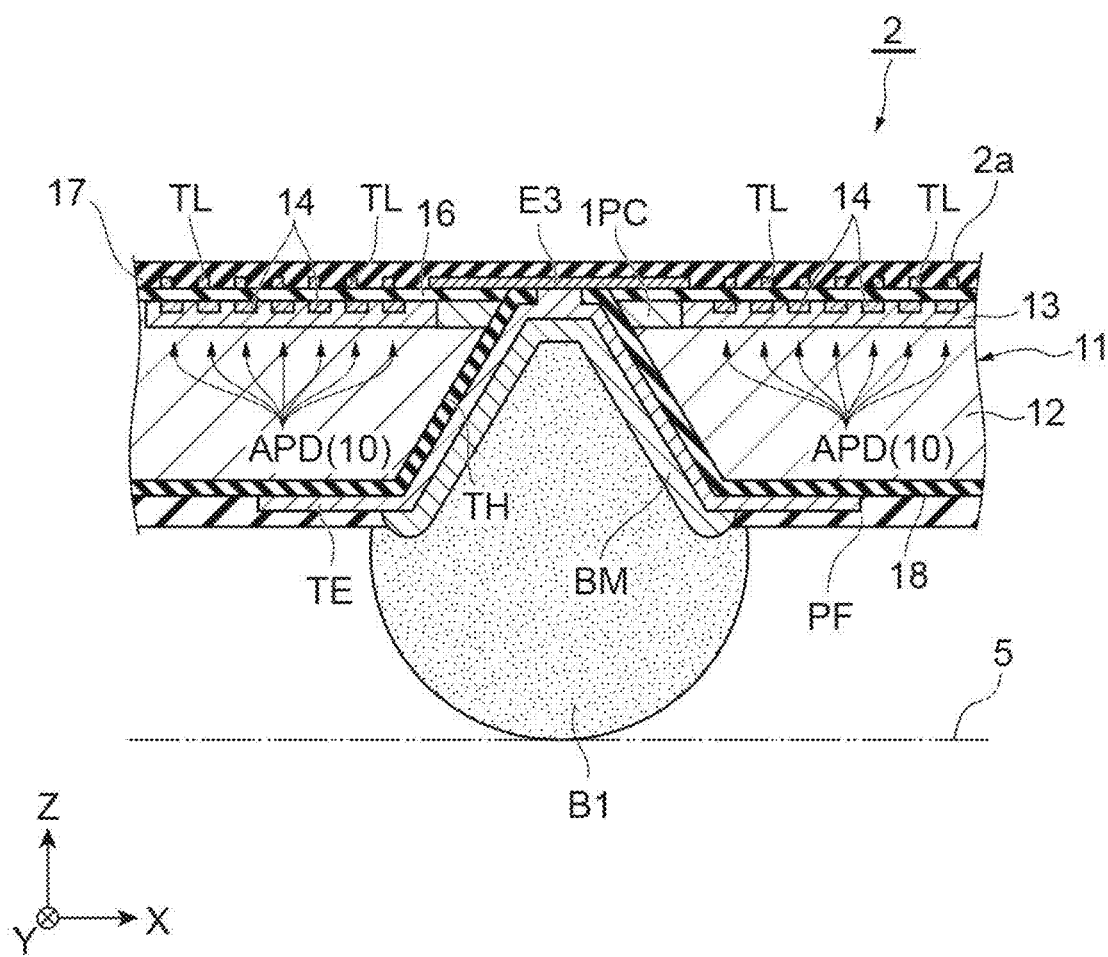
FIG. 5 is a cross-sectional view of a portion of the light detection substrate shown in FIG. 1.

As shown in FIG. 5, the light detection substrate 2 includes a semiconductor layer 11. The semiconductor layer 11 includes an N-type (first conductivity type) semiconductor region 12, a P-type (second conductivity type) semiconductor region 13, and a plurality of P-type semiconductor regions 14. The semiconductor region 13 is formed on a surface of the semiconductor region 12 on the light incident side. The plurality of semiconductor regions 14 are formed in the semiconductor region 13 along a surface of the semiconductor region 13 on the light incident side. The impurity concentration of each semiconductor region 14 is higher than that of the semiconductor region 13.

In the light detection substrate 2, one avalanche photodiode APD is formed by one semiconductor region 14 and regions of the semiconductor regions 12 and 13 that overlaps the one semiconductor region 14 in the Z-axis direction (i.e., a light receiving region LA (see FIG. 7)). That is, each avalanche photodiode APD includes the N-type semiconductor region 12 and the P-type semiconductor regions 13 and 14 that form PN junctions with the N-type semiconductor region 12. The P-type semiconductor regions 13 and 14 are located on a side of the light incident surface 2a of the light detection substrate 2 with respect to the N-type semiconductor region 12.

An insulating layer 16 is formed on a surface of the semiconductor region 13 on the light incident side. The common electrode E3 and the readout wiring TL are disposed on the insulating layer 16. The common electrode E3 and the readout wiring TL are covered by an insulating layer 17. In the light detection substrate 2, a surface of the insulating layer 17 on the light incident side corresponds to the light incident surface 2a. In each of the light detection units 10, one end of the quenching resistor R1 (see FIG. 4) is electrically connected to the semiconductor regions 13 and 14 of the avalanche photodiode APD, and the other end of the quenching resistor R1 is electrically connected to the readout wiring TL.

A through hole TH is formed in the semiconductor layer 11. An insulating layer 18 is formed on an inner surface of the through hole TH and a surface of the semiconductor region 12 opposite to the light incident side. A through electrode TE is disposed on the inner surface of the through hole TH via the insulating layer 18. The through electrode TE is connected to the common electrode E3 at an opening of the through hole TH on the light incident side. A bump electrode B1 is disposed on the through electrode TE via an under-bump metal BM. The through electrode TE and the insulating layer 18 are covered by a passivation film PF. Note that an N-type semiconductor region 1PC is formed in a region surrounding the through hole TH on the surface of the semiconductor region 12 on the light incident side. The semiconductor region 1PC prevents the PN junction formed by the N-type semiconductor region 12 and the P-type semiconductor regions 13 and 14 from reaching the through hole TH.

Figure 6:
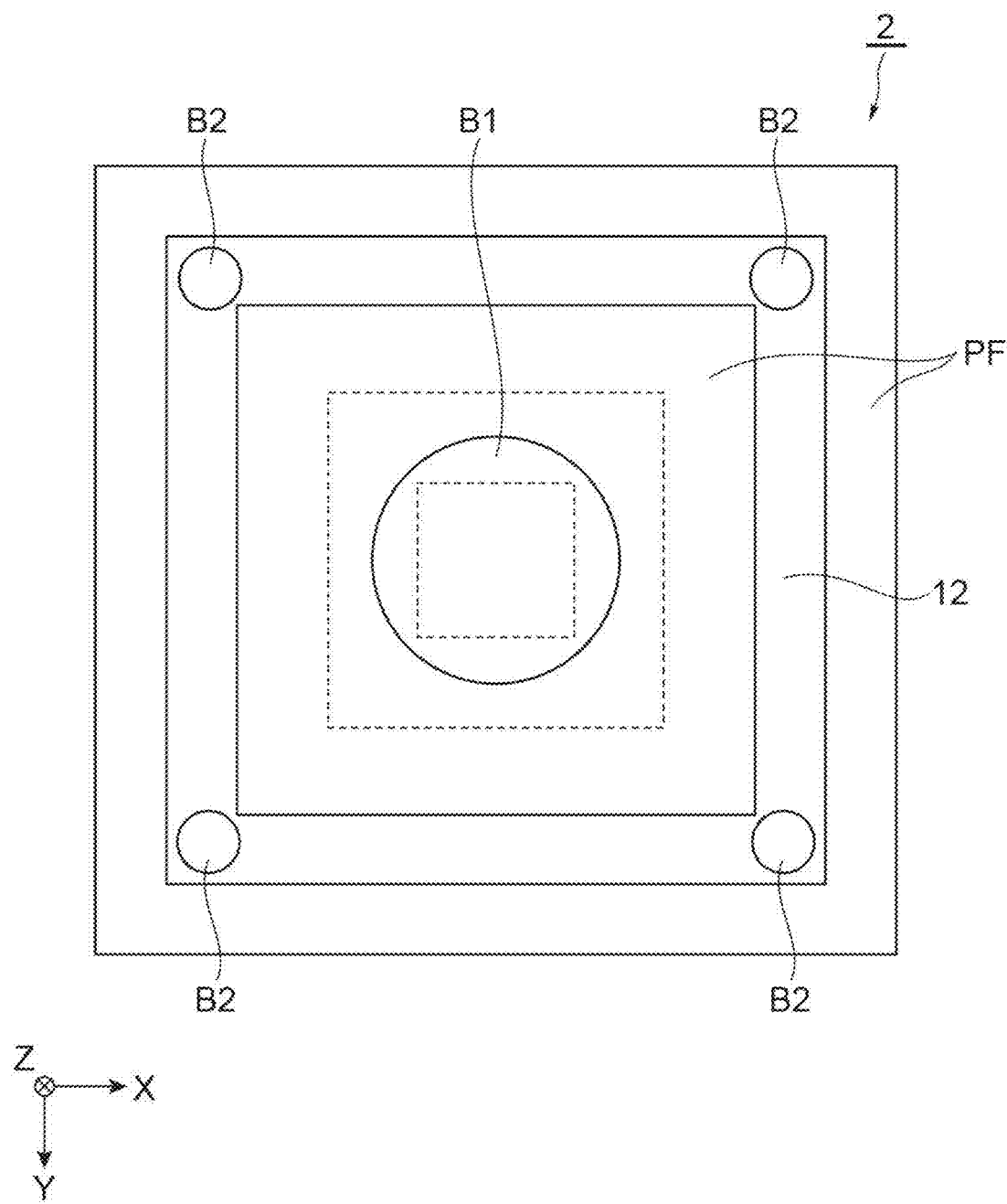
FIG. 6 is a bottom view of the light detection substrate shown in FIG. 1.

As shown in FIG. 6, a groove is formed in the passivation film PF so as to surround the through hole TH when viewed in the Z-axis direction, and the semiconductor region 12 is exposed in the groove. A plurality of bump electrodes B2 are disposed on the semiconductor regions 12 exposed in the groove. The bump electrode B1 and the plurality of bump electrodes B2 are electrically and physically connected to the wiring substrate 5 disposed on a side opposite to the lens layer 3 with respect to the light detection substrate 2. That is, the light detection substrate 2 is electrically and physically connected to the wiring substrate 5.

In the light detection substrate 2 configured as described above, the avalanche photodiode APD in each light detection unit 10 is operated in the Geiger mode. In this state, when light is incident on the semiconductor region 12 from the light incident surface 2a side, photoelectric conversion occurs in the semiconductor region 12, and photoelectrons (electric charges) are generated in the semiconductor region 12. In the avalanche photodiode APD in which photoelectrons are generated, avalanche multiplication occurs in the semiconductor region 13, and an amplified electron group (electric charges) is collected in the common electrode E3 via the semiconductor region 14 and the quenching resistor R1. The electric charges collected from each light detection unit 10 to the common electrode E3 are input to the signal processing unit SP (see FIG. 3) of the wiring substrate 5 as a signal.

The semiconductor layer 11 is formed of, for example, silicon (Si). In the semiconductor layer 11, the P-type impurity is, for example, Group 3 element such as boron (B), and the N-type impurity is, for example, Group 5 element such as nitrogen (N), phosphorus (P), or arsenic (As). A method of adding these impurities is, for example, a diffusion method or an ion injection method. Each insulating layer 16, 17, or 18 is formed of, for example, $SiO_2$ or SiN. A method of forming each insulating layer 16, 17, or 18 is, for example, a thermal oxidation method or a sputtering method. The electrode E1, the common electrode E3, and the through electrode TE are made of metal such as aluminum. The electrode E1, the common electrode E3, and the through electrode TE are formed by, for example, sputtering. The resistivity of the quenching resistor R1 is higher than that of the electrode E1 and that of the common electrode E3. The quenching resistor R1 is formed of, for example, polysilicon. A method of forming the quenching resistor R1 is, for example, a chemical vapor deposition (CVD) method. The material of the quenching resistor R1 may be, for example, SiCr, NiCr, TaNi, FeCr, or the like.

Figure 7:
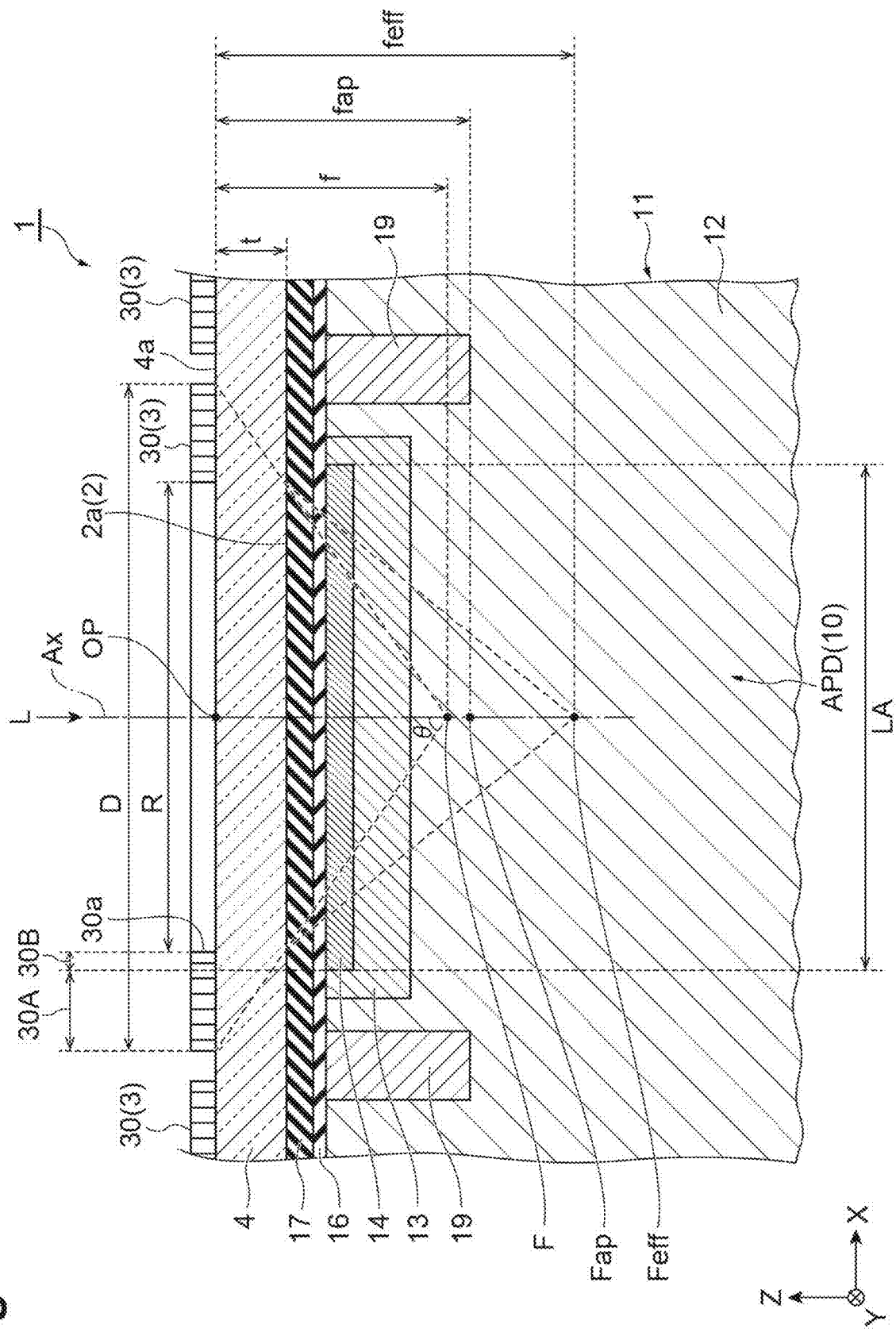
FIG. 7 is a cross-sectional view of a portion corresponding to one light detection unit of the light detector shown in FIG. 1.

As shown in FIG. 7, the light detection substrate 2 has a trench 19. The trench 19 is provided so as to partition the light detection units adjacent to each other on the surface of the semiconductor layer 11 on the light incident side. The trench 19 functions as an isolation region that isolates each avalanche photodiode APD forming each light receiving region LA. In the trench 19, for example, an insulating material such as silicon oxide, a metal material such as tungsten, polysilicon, or the like may be disposed.

Figure 9:
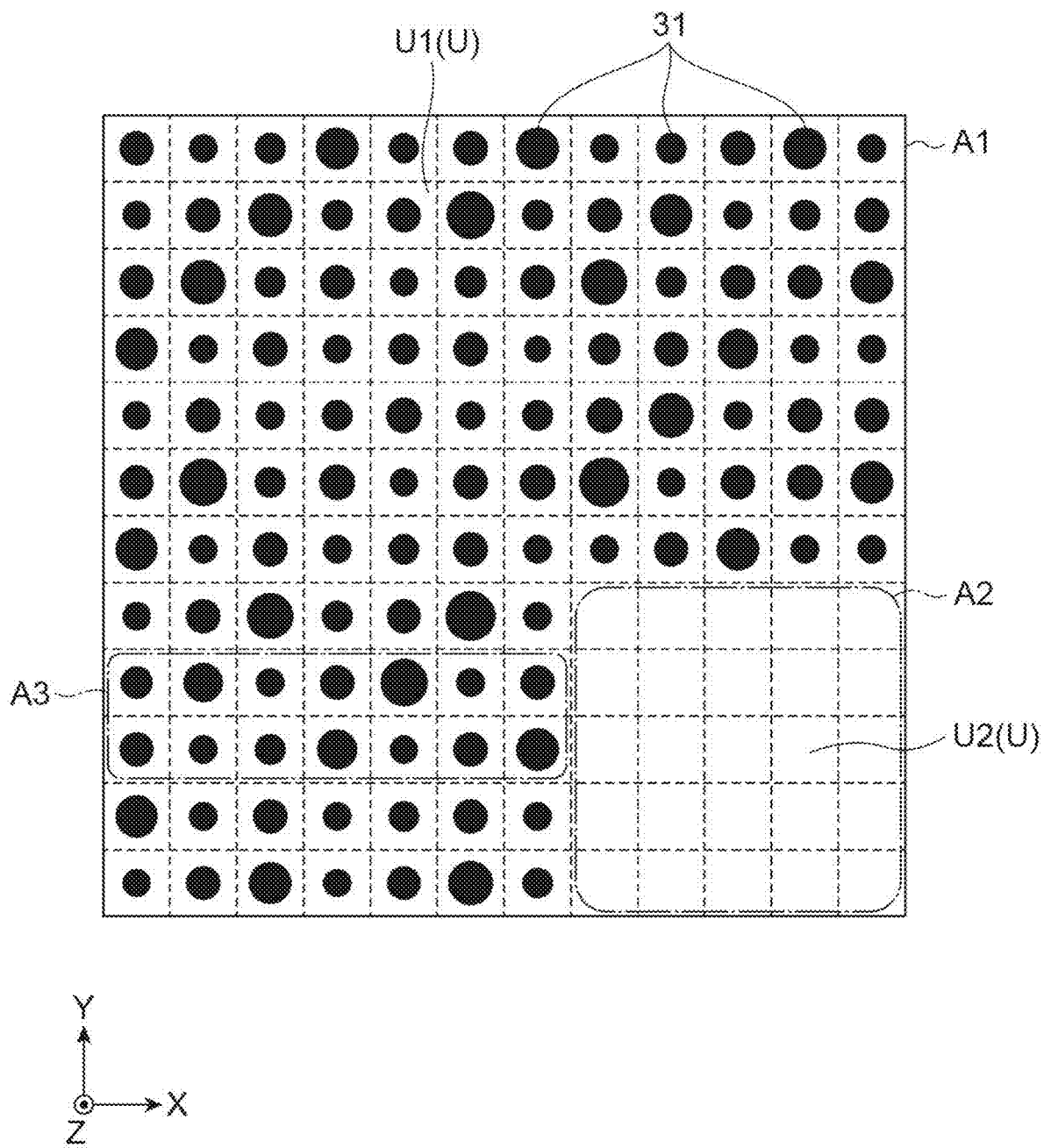
FIG. 9 is an enlarged view of the region A1 shown in FIG. 8.

As shown in FIGS. 7, 8, and 9, in the present embodiment, each meta-lens 30 included in the lens layer 3 is provided on the upper surface 4a of the dielectric layer 4 on a side opposite to the light detection substrate 2. That is, each meta-lens 30 is disposed on the light incident surface 2a of the light detection substrate 2 through the dielectric layer 4. The meta-lens 30 is a meta-surface structure that functions as a lens that collects (focuses) detection target light incident on the light incident surface 2a.

The dielectric layer 4 is a light transmission substrate that transmits the detection target light L. The dielectric layer 4 is bonded to the light incident surface 2a of the light detection substrate 2 by an adhesive having optical transparency. The dielectric layer 4 is formed of a material having a refractive index n2 (n2<n1) lower than the refractive index n1 of the light detection substrate 2 (semiconductor layer 11). The dielectric layer 4 may be formed of, for example, $SiO_2$, GaAs, GaP, Si, SiC or the like. The thickness t (length in the Z-axis direction) of the dielectric layer 4 is, for example, 1 μm to 10 μm.

Each meta-lens 30 is disposed to correspond to each light detection unit 10. In other words, one meta-lens 30 is provided for one light detection unit 10. The meta-lens 30 corresponding to a certain light detection unit 10 is disposed on the light incident surface 2a so as to focus the detection target light L on the light receiving region LA of the certain light detection unit 10. Each meta-lens 30 is formed of a meta-lens material such as a-Si (amorphous silicon), $HfO_2$, $Nb_2O_5$, $TiO_2$, or the like.

As illustrated in FIG. 8, as an example, one meta-lens 30 corresponding to one light detection unit 10 is formed in a rectangular shape (square shape in the embodiment) when viewed in the Z-axis direction (that is, thickness direction of the light detection substrate 2). The meta-lens 30 is composed of a plurality of unit structures 31. In the present embodiment, the unit structure 31 is a columnar pillar.

When viewed in the Z-axis direction, an opening region 30a in which the unit structure 31 is not formed is provided in a region including the center C of the meta-lens 30. That is, the plurality of unit structures 31 are formed in an annular (square annular in the present embodiment) region A excluding the opening region 30a in the region (square region in the present embodiment) in which the meta-lens 30 is disposed, and are not formed in the opening region 30a. In FIG. 8, only a part of the unit structures 31 formed in the upper left corner portion of the region where the meta-lens 30 is disposed is illustrated, but the plurality of unit structures 31 are formed in the entire annular region A excluding the opening region 30a.

When viewed in the Z-axis direction, the opening region 30a has a rectangular shape. In the present embodiment, as an example, the opening region 30a has a square shape. The width R of the opening region 30a is greater than or equal to a half of the width D of the meta-lens 30. In a case where the opening region 30a is formed in a square shape as in the present embodiment, the width R of the opening region 30a is a length of one side of the opening region 30a. In addition, when the opening region 30a is formed in a circular shape as in a second modification example to be described later, the width R of the opening region 30a is a diameter of the opening region 30a. Similarly to the width R of the opening region 30a, the width D of the meta-lens 30 is a length of one side of the meta-lens 30 when the meta-lens 30 has a square shape, and a diameter of the meta-lens 30 when the meta-lens 30 has a circular shape.

In addition, as shown in FIG. 7, when viewed in the Z-axis direction, the meta-lens 30 (that is, the region A in which the unit structure 31 is formed) is formed to overlap both an adjacent region adjacent to the light receiving region LA (a portion outside the light receiving region LA) and a peripheral region which is a region inside the light receiving region LA along a boundary between the light receiving region LA and the adjacent region. That is, the meta-lens 30 (region A) has a portion 30A overlapping the adjacent region and a portion 30B overlapping the peripheral region. According to the above-described configuration, even when the light receiving region LA is small, the meta-lens 30 (unit structure 31) is formed in a portion overlapping both the adjacent region and the peripheral region, so that the detection target light L can be reliably focused on the light receiving region LA.

FIG. 9 is an enlarged view of the region A1 shown in FIG. 8. As shown in FIG. 9, the plurality of unit structures 31 are arranged in a grid pattern (square grid pattern in the present embodiment). More specifically, unit areas U separated by broken lines in FIG. 9 are arranged in a lattice pattern. One unit structure 31 is provided in one unit area U1 included in the area A. The width d (see FIGS. 10A to 10C) of the unit structure 31 included in each unit area U1 is set based on the phase design of the meta-lens 30. On the other hand, the unit structure 31 constituting the meta-lens 30 is not provided in each unit area U2 included in the area A2 included in the opening region 30a among the area A1. Note that the unit structures 31 do not necessarily have to be provided in all the unit areas U1 included in the region A, and may be provided in a plurality of unit areas U1 included in the region A to the extent that the effect of the present invention is sufficiently exhibited. That is, the unit structure 31 may not be formed in a part of the unit areas U1 included in the region A outside the opening region 30a. Related to the above, the opening region 30a does not necessarily need to be a region surrounded by the plurality of unit structures 31 over the entire circumference thereof. For example, as illustrated in FIG. 9, the unit structure 31 may not be formed in a partial region A3 included in the region A.

As illustrated in FIGS. 10A to 10C, the meta-lens 30 is a nanostructure (fine concave-convex structure) in which unit areas U1, which are basic structures (unit cells), are periodically arranged in a grid pattern along the X-axis direction and the Y-axis direction in a region A in which a unit structures 31 are formed. As an example, the unit area U1 is a square region when viewed in the Z-axis direction. The unit structure 31 stands on the upper surface 4a of the dielectric layer 4 at the center of the unit area U1.

The period P of the unit structures 31 (i.e., the distance between the centers of the unit structures 31 adjacent to each other and the length of one side of the unit area U1) is set to be shorter than the wavelength of the detection target light L to be analyzed. That is, the meta-lens 30 has a sub-wavelength structure of the detection target light L.

As an example, when the wavelength λ of the detection target light L are 905 nm and the unit structures 31 are formed by a-Si, the period P of the unit structures 31 is set to 375 nm, the heights h of the unit structures 31 are set to 490 nm, and the widths d of the unit structures 31 are selected from the range of 140 nm to 270 nm according to the phase design and the positions of the unit areas U1.

As another example, when the wavelength λ of the detection target light L is 905 nm and the unit structures 31 are formed by $TiO_2$, the period P of the unit structures 31 may be set to 441 nm, the heights h of the unit structures 31 may be set to 1000 nm, and the widths d of the unit structures 31 may be selected from the range of 80 nm to 380 nm according to the phase design and the positions of the unit areas U1.

As in the above example, the height h of the unit structure 31 is set to a constant value in the entire meta-lens 30 (that is, all the unit area U1). On the other hand, the widths d of the unit structures 31 in each unit area U1 are selected from the above range in accordance with the position of each unit area U1. As described above, the widths d of the unit structures 31 in each unit area U1 are set in accordance with the positions of each unit area U1, the amount of phase modulation is controlled for each position of each unit area U1, and the meta-lens 30 functioning as a condenser lens is obtained. For example, the meta-lens has a structure in which a plurality of regions for one cycle (region including a plurality of unit areas U1) formed such that the phase continuously changes by 2π along the radial direction from the outside of the meta-lens 30 toward the center C when viewed in the Z-axis direction are repeatedly arranged along the radial direction.

The structure of the meta-lens 30 described above will be supplemented. As types of meta-lens structure (metasurface structure), so-called refractive index modulation type and resonance type are known. The meta-lens 30 may have any of the metasurface structures described above. The metasurface structure of the refractive index modulation type is a structure of controlling an effective refractive index determined by a filling rate (occupancy) of a meta-lens material in each of the unit area U1. The metasurface structure of the resonance type is a structure of controlling phase and transmissivity by adjusting electric resonance and magnetic resonance according to the structure of each unit area U1 (that is, the shape and size of a nanostructure composed of a plurality of regularly arranged concave-convex structures).

More specifically, the resonance type metasurface structure is a structure of realizing the above-described lens function by adjusting a transmittance coefficient t represented by the following Equation (1). In the following Equation (1), $\omega_{e,k}$ represents a resonance frequency related to electric resonance in the k-th order mode, and $\omega_{m,k}$ represents a resonance frequency related to magnetic resonance in the k-th order mode. In addition, co represents a resonance angular frequency in the Lorentz oscillator model that describes electron polarization. In addition, $\gamma_{e,k}$ represents an attenuation coefficient related to electric resonance of the k-th order mode in the Lorentz oscillator model, and $\gamma_{m,k}$ represents an attenuation coefficient related to magnetic resonance of the k-th order mode in the Lorentz oscillator model. In addition, $a_k$ is a parameter representing the degree of contribution of electric resonance in the k-th order mode in the Lorentz oscillator model, and $b_k$ is a parameter representing the degree of contribution of magnetic resonance in the k-th order mode in the Lorentz oscillator model. The resonance type metasurface structure includes a Huygens type (Nanodisk type) corresponding to a case of "m=n=1" in the following Equation (1) (that is, a case of using resonance of electric dipoles and magnetic dipoles in a single mode) and an HCG type (Micropost type) corresponding to a case other than "m=n=1" in the following Equation (1) (that is, a case of using resonance in a higher order mode). When the meta-lens 30 is configured by the resonance type metasurface structure, any type of the Huygens type and the HCG type described above may be used.

$$t = 1 + \sum_{k=1}^{m} a_k \frac{2i\gamma_{e,k}\omega}{\omega_{e,k}^2 - \omega^2 - 2i\gamma_{e,k}\omega} + \sum_{k=1}^{n} b_k \frac{2i\gamma_{m,k}\omega}{\omega_{m,k}^2 - \omega^2 - 2i\gamma_{m,k}\omega} \quad (1)$$

In a case where the refractive index modulation type is adopted as the structure of the meta-lens 30, it is possible to secure robustness with respect to a change in the wavelength of the detection target light L, compared to a case where the resonance type is adopted. On the other hand, when the resonance type is adopted, the phase change can be made sharp and high transmittance can be secured as compared with the refractive index modulation type. In addition, when the Huygens type is adopted, the aspect ratio of the unit structure 31 can be reduced (that is, the ratio of the height to the width of the unit structure 31 can be reduced) as compared with the refractive index modulation type and the HCG type, and thus the structure of the meta-lens 30 can be made more robust. On the other hand, when the HCG type is adopted, since it is possible to use resonance of a plurality of higher-order modes, it is possible to increase the degree of freedom of the structural design of the meta-lens 30.

An example of a manufacturing process of the meta-lens 30 will be described with reference to FIG. 11. First, a silicon layer 130 (amorphous silicon) including a portion to be a meta-lens 30 (that is, a plurality of unit structures 31) is formed on the upper surface 4a of the dielectric layer 4 (for example, a quartz substrate) by a sputtering method (step S1). The thickness of the silicon layer 130 is set to a design value (490 nm in the above example) of the height h of the unit structure 31. Subsequently, an electron-beam (EB) resist 100 having a thickness of about 300 nm is applied on the front side of the silicon layer 130 (the side opposite to the dielectric layer 4) (step S2). Subsequently, a pattern designed in advance is EB-drawn on the EB resist 100 by an EB lithography method (step S3). More specifically, openings 100a corresponding to a portion in which the unit structure 31 is not formed in each unit area U1 included in the region A described above and an opening region 30a are formed in the EB resist 100. Subsequently, by performing etching (for example, dry etching such as inductively coupled plasma (ICP-RIE) etching) using the EB resist 100 as a mask, a portion (that is, an exposed portion) of the silicon layer 130 corresponding to the opening 100a of the EB resist 100 is removed. Thereafter, the EB resist 100 is stripped (step S4). As described above, the meta-lens 30 (that is, a structure in which a plurality of unit structures 31 are periodically arranged) is formed on the upper surface 4a of the dielectric layer 4.

As shown in FIG. 7, when a maximum angle between a detection target light L passing through the meta-lens 30 and the dielectric layer 4 and an optical axis AX of the meta-lens 30 is θ and a refractive index of a medium (in this example, the dielectric layer 4) through which the detection target light L passes is n, a numerical aperture NA of the meta-lens 30 is determined by Equation (2) below. The optical axis AX is an axis that passes through the center C of the meta-lens 30 and is parallel to the Z-axis direction.

$$NA = n \times \sin\theta \qquad (2)$$

The effective wavelength Xeff of the detection target light L passing through the dielectric layer 4 is determined by the following Equation (3), where X is the wavelength of the detection target light L in air. The period P of the meta-lens 30 is set within a range satisfying the following Equation (4).

$$\lambda_{eff} = \lambda/n \qquad (3)$$

$$\lambda_{eff}/2 < P < \lambda_{eff} \qquad (4)$$

In this case, the numerical aperture NA of the meta-lens 30 may be preferably selected to satisfy the following Equation (5).

$$\frac{\lambda_{eff}}{4*P} < NA < \frac{\lambda_{eff}}{2*P} \qquad (5)$$

By setting the numerical aperture NA within a range satisfying the above Equation (5), the maximum angle θ (see FIG. 7) is set so as to satisfy the following Equation (6).

$$\sin^{-1}\left(\frac{\lambda_{eff}}{4*P}\right) < \theta < \sin^{-1}\left(\frac{\lambda_{eff}}{2*P}\right) \qquad (6)$$

In addition, a focal length f up to a virtual focus point F (a focus point when it is assumed that a medium through which the detection target light L passes from passing through the meta-lens 30 to reaching the focus point is only the dielectric layer 4) corresponding to the selected maximum angle θ is determined by Equation (7) below. The focal length f is a length from the origin OP to the focus point F when the intersection of the optical axis AX and the upper surface 4a of the dielectric layer 4 is defined as the origin OP.

$$f = D/(2 \times \tan\theta) \qquad (7)$$

In the present embodiment, the detection target light L that has passed through the dielectric layer 4 passes through the semiconductor layer 11. The detection target light L also passes through the insulating layers 16 and 17. However, since the insulating layers 16 and 17 are very thin compared to the dielectric layer 4 and the semiconductor layer 11, the insulating layers 16 and 17 are ignored here as they are within an error range. In this case, a focal length $f_{eff}$ (second distance) from the origin OP to an effective focus point $F_{eff}$ considering that the detection target light L passes through the semiconductor layer 11 is determined by the following Equation (8) when the thickness of the dielectric layer 4 is represented by t and the refractive index of the semiconductor layer 11 (Si in the present embodiment) is represented by $n_{Si}$. Here, the focus point $F_{eff}$ is a focus point based on a phase design of the meta-lens 30 (and a medium through which the detection target light L passes after passing through the meta-lens 30) and is a focus point determined regardless of the opening region 30a.

$$F_{eff} = t(f-t) \times n_{Si}/n \qquad (8)$$

In the present embodiment, as an example, the width d of each unit structure 31 constituting the meta-lens 30 is set such that the phase φ (x, y) at each coordinate (x, y) satisfies the following Equation (9). That is, the plurality of unit structures 31 may be configured such that the phase distribution of the meta-lens 30 follows a quadratic phase pattern. Here, as shown in FIG. 8, the coordinates (x, y) are two dimensional coordinates in a case where the center C is set as the origin (0, 0).

$$\varphi(x, y) = -\frac{2\pi}{\lambda_{eff}} \frac{2f}{\left(\sqrt{x^2 + y^2}\right)^2} \qquad (9)$$

As a result of intensive studies by the present inventors, the following findings were obtained. That is, by providing the opening region 30a as described above in the meta-lens 30, the light-condensing point $F_{ap}$ (see FIG. 7) caused by the influence of the diffraction (opening diffraction) by the opening region 30a is formed at a position closer to the light incident surface 2a than the effective focus point $F_{eff}$. In the example of FIG. 7, the light-condensing point $F_{ap}$ is located between the focus point F and the focus point $F_{eff}$, but the light-condensing point $F_{ap}$ may be formed at a position closer to the light incident surface 2a than the focus point F. In addition, the position of the light-condensing point $F_{ap}$ may be adjusted by adjusting the size of the width R of the opening region 30a with respect to the width D of the meta-lens 30, a phase distribution pattern (a secondary phase pattern in the present embodiment) of the meta-lens 30, a numerical aperture NA of the meta-lens 30, or the like. Based on the above knowledge, the meta-lens 30 is preferably formed such that the light-condensing distance $f_{ap}$ (first distance) from the origin OP to the light-condensing point $F_{ap}$ is 40% or more and 90% or less of the focal length $f_{eff}$. More preferably, the meta-lens 30 is formed such that the light-condensing distance $f_{ap}$ is 50% or more and 80% or less of the focal length $f_{eff}$.

According to the light detector 1 described above, it is possible to simultaneously generate diffraction by the meta-lens 30 (the plurality of unit structures 31) and diffraction by the opening region 30a (opening diffraction). By simultaneously generating two types of diffraction in this manner, it is possible to form the light-condensing point $F_{ap}$ at a position closer to the light incident surface 2a than the focus point in the case where only diffraction by the meta-lens 30 occurs (that is, the focus point $F_{eff}$ set by the plurality of unit structures 31 constituting the meta-lens 30). That is, according to the light detector 1, by providing the opening region 30a, it is possible to focus light on a position closer to the light incident surface 2a than the focus point $F_{eff}$ based on the phase design of the meta-lens 30.

The light detection substrate 2 includes avalanche photodiodes APD. In the present embodiment, an interface between the semiconductor region 12 and the semiconductor region 13 is an interface of a PN junction. By focusing light on a position as close as possible to such an interface (that is, a portion of the semiconductor region 12 as close as possible to the semiconductor region 13), it is possible to effectively improve the light receiving sensitivity of the light detection unit 10 (avalanche photodiode APD). In addition, when the light detection substrate 2 is a SiPM as in the present embodiment, the temporal resolution can be improved by focusing the detection target light L on the front side of the light detection substrate 2 (a position close to the light incident surface 2a) as much as possible. As described above, according to the light detector 1, the light-condensing point $F_{ap}$ is formed at a position closer to the boundary surface between the semiconductor region 12 and the semiconductor region 13 than the focus point $F_{eff}$ based on the phase design of the meta-lens 30. As a result, it is possible to effectively improve the light receiving sensitivity of the light detection unit 10. In addition, as in the present embodiment, by combining the light detection substrate 2 which is a surface-incident type photodiode with a meta-lens which includes an opening (that is, a meta-lens 30 provided with an opening region 30a), it is possible to focus the detection target light L on a position as shallow as possible in the semiconductor layer 11, and as a result, it is possible to effectively improve light receiving sensitivity.

Further, the numerical aperture NA of the meta-lens 30 is set so as to satisfy the above Equation (5). According to the findings of the present inventor, with the above-described configuration, it is possible to more reliably form the light-condensing point $F_{ap}$ at a position closer to the light incident surface 2a than the focus point $F_{eff}$ based on the phase design of the meta-lens 30.

When viewed in the Z-axis direction, the width R of the opening region 30a is equal to or greater than a half of the width D of the meta-lens 30. According to the findings of the present inventor, the light-condensing point $F_{ap}$ can be more reliably formed at a position closer to the light incident surface 2a than the focus point $F_{eff}$ based on the phase design of the meta-lens 30 by making the width R of the opening region 30a sufficiently larger than the width D of the meta-lens 30 as described above.

Hereinafter, effects of the light detector 1 of the present embodiment (first example to fourth example) will be described based on a first example to a fourth example (FIGS. 12A to 15C) and a comparative example (FIGS. 16A to 16C). The parameters for each example and comparative example are shown in the table below (Table 1). In any case, the phase distribution pattern of meta-lens is a quadratic phase pattern represented by the above Equation (9).

TABLE 1

| | First Example | Second Example | Third Example | Fourth Example | Comparative Example |
|---|---|---|---|---|---|
| Width D (μm) | 15 | 15 | 15 | 20 | 15 |
| Width R (μm) | 10 | 9 | 11 | 14 | 0 |
| NA | 1.02 | 1.02 | 0.86 | 0.86 | 1.02 |

First Example

FIGS. 12A to 12C illustrate simulation results of a meta-lens phase pattern and light intensity distribution of the first example light detector 1. More specifically, FIG. 12A shows a phase pattern in which the center C (see FIG. 8) of the meta-lens 30 is the origin (0, 0). FIG. 12B shows the distribution of the intensity of the detection target light L at each coordinate when the origin OP is the origin (0, 0) and the direction from the origin OP toward the semiconductor layer 11 is the positive direction of the Z-axis direction. FIG. 12C shows the intensity distribution of the detection target light L at each position (Z-axis coordinate) along the optical axis AX. FIGS. 13A to 18C and FIGS. 20A to 20C described later are the same as FIGS. 12A to 12C.

The rectangular black region at the central portion shown in FIG. 12A corresponds to the opening region 30a where the unit structures 31 are not formed. As shown in FIGS. 12B and 12C, according to the light detector 1 of the first example, it was confirmed that the light-condensing point $F_{ap}$ caused by the opening diffraction by the opening region 30a was formed at a position closer to the light incident surface 2a than the focus point Fell based on the phase design of the meta-lens 30.

Second Example

FIG. 13A to 13C illustrate simulation results of a meta-lens phase pattern and light intensity distribution of the light detector 1 of the second example. The rectangular black region in the central portion shown in FIG. 13A corresponds to the opening region 30a where the unit structures 31 are not formed. As shown in FIGS. 13B and 13C, also in the light detector 1 of the second example, it was confirmed that the light-condensing point $F_{ap}$ caused by opening diffraction by the opening region 30a was formed at a position closer to the light incident surface 2a than the focus point $F_{eff}$ based on the phase design of the meta-lens 30.

Third Example

FIGS. 14A to 14A illustrate simulation results of a meta-lens phase pattern and light intensity distribution of the light detector 1 of the third example. The rectangular black region at the central portion shown in FIG. 14A corresponds to the opening region 30a where the unit structures 31 are not formed. As shown in FIGS. 14B and 14C, also in the light detector 1 of the third example, it was confirmed that the light-condensing point $F_{ap}$ caused by opening diffraction by the opening region 30a was formed at a position closer to the light incident surface 2a than the focus point $F_{eff}$ based on the phase design of the meta-lens 30.

Fourth Example

FIGS. 15A to 15C illustrate simulation results of a meta-lens phase pattern and light intensity distribution of the fourth example light detector 1. The rectangular black region at the central portion shown in FIG. 15A corresponds to the opening region 30a where the unit structures 31 are not formed. As shown in FIGS. 15B and 15C, also in the light detector 1 of the fourth example, it was confirmed that the light-condensing point $F_{ap}$ caused by opening diffraction by the opening region 30a was formed at a position closer to the light incident surface 2a than the focus point $F_{eff}$ based on the phase design of the meta-lens 30.

Comparative Example

FIGS. 16A to 16C illustrate simulation results of a meta-lens phase pattern and light intensity distribution of a light detector of the comparative example. The comparative example is different from the first example in that the opening region is not formed. That is, in the meta-lens of the light detector of comparative example, a plurality of unit structures 31 are also formed in a region corresponding to the opening region 30a of the meta-lens 30 of the first example in accordance with the secondary phase pattern represented by the above Equation (9). Therefore, as shown in FIG. 16A, a phase pattern is formed in the entire region where the meta-lens 30 is disposed. As illustrated in FIGS. 16B and 16C, in the comparative example, only the focus point $F_{eff}$ based on the phase design of the meta-lens is formed, and the light-condensing point corresponding to the light-condensing point $F_{ap}$ in the first example to the fourth example is not formed.

As described above, although the positions of the focus point $F_{eff}$ and the light-condensing point $F_{ap}$ and the intensity distribution of light change in accordance with the parameters of the meta-lens (the width D of the meta-lens, the width R of the opening region, and the numerical aperture NA), it was confirmed that an effect of forming the light-condensing point $F_{ap}$ in front of the focus point $F_{eff}$ was obtained in any of the examples. In contrast, in the comparative example using the meta-lens in which the opening region is not formed, the light-condensing point corresponding to the light-condensing point $F_{ap}$ is not formed, and thus it is confirmed that the above-described effect is not obtained. That is, from the result of the simulation, it was confirmed that the light-condensing point $F_{ap}$ may be formed at a position closer to the meta-lens than the focus point Fell only by the meta-lens 30 by forming the opening region 30a in the region including the center C of the meta-lens 30.

First Modification Example

In the above-described embodiment, the plurality of unit structures 31 are configured such that the phase distribution of the meta-lens 30 follows the secondary phase pattern represented by Equation (9). However, a pattern other than the secondary phase pattern may be used as the phase distribution pattern of the meta-lens 30. In the light detector 1 of the first modification example, the width d of each unit structure 31 constituting the meta-lens 30 is set such that the phase ϕ (x, y) at each coordinate (x, y) satisfies the following Equation (10). That is, in the light detector 1 of the first modification example, the plurality of unit structures 31 may be configured such that the phase distribution of the meta-lens 30 follows a Fresnel pattern instead of the quadratic phase pattern. Here, as shown in FIG. 8, the coordinates (x, y) are two dimensional coordinates in a case where the center C is set as the origin (0, 0).

$$\varphi(x, y) = -\frac{2\pi}{\lambda_{eff}}\left(\sqrt{x^2 + y^2 + f^2} - f\right). \quad (10)$$

The first modification example is different from the first example in that the phase pattern of the meta-lens 30 follows the Fresnel pattern represented by the above Equation (10), and the other parameters of the meta-lens (the width D of the meta-lens, the width R of the opening region, and the numerical aperture NA) are the same as those of the first example.

FIGS. 17A to 17C illustrate simulation results of a meta-lens phase pattern and light intensity distribution of a light detector according to the first modification example. As shown in FIGS. 17B and 17C, also in the light detector 1 of the first modification example, it was confirmed that the light-condensing point $F_{ap}$ caused by opening diffraction by the opening region 30a was formed at a position closer to the light incident surface 2a than the focus point $F_{eff}$ based on the phase design of the meta-lens 30.

However, the light intensity (contrast) at the light-condensing point $F_{ap}$ in the first example (see FIGS. 12B and 12C) is larger than the light intensity at the light-condensing point $F_{ap}$ in the first modification example (see FIGS. 17B and 17C). That is, when the plurality of unit structures 31 are configured such that the phase distribution of the meta-lens 30 follows the second order phase pattern, the focusing effect on the light-condensing point $F_{ap}$ formed at a position closer to the light incident surface 2a than the focus point $F_{eff}$ (focus point based on the phase design of the meta-lens) may be improved compared to a case where a pattern (e.g., a Fresnel pattern) other than the second order phase pattern is applied to the phase distribution of the meta-lens 30.

Second Modification Example

In the above-described embodiment, the opening region 30a is formed in a rectangular shape (square shape), but the opening region 30a may be formed in a shape other than the rectangular shape. In the light detector 1 of the second modification example, the opening region 30a of the meta-lens 30 is formed in a circular shape. The second modification example is different from the first example in that the opening region 30a is formed in a circular shape centered on the center C when viewed in the Z-axis direction, and the other parameters of the meta-lens (the width D of the meta-lens, the width R of the opening region, and the numerical aperture NA) are the same as those of the first example. That is, in the second example, the opening region 30a is a circular region with a radius (radius R) of 10 μm centered on the center C.

FIGS. 18A to 18C illustrate simulation results of a meta-lens phase pattern and light intensity distribution of a light detector of the second modification example. As illustrated in FIG. 18A, in the second modification example, an opening region 30a (black region) is provided in a circular shape. In addition, as shown in FIGS. 18B and 18C, also in the light detector 1 of the second modification example, it was confirmed that the light-condensing point $F_{ap}$ caused by opening diffraction by the opening region 30a was formed at a position closer to the light incident surface 2a than the focus point $F_{eff}$ based on the phase design of the meta-lens 30.

However, the light intensity (contrast) at the light-condensing point $F_{ap}$ in the first example (see FIGS. 12B and 12C) is larger than the light intensity at the light-condensing point $F_{ap}$ in the second modification example (see FIGS. 18B and 18C). That is, it was confirmed that by forming the opening region 30a of the meta-lens 30 in a rectangular shape (square shape), the light condensing effect on the light-condensing point $F_{ap}$ formed at a position closer to the light incident surface 2a than the focus point $F_{eff}$ (focus point based on the phase design of the meta-lens) can be improved compared to a case where the opening region 30a is formed in a shape (for example, circular shape) other than the rectangular shape.

Third Modification Example

In the embodiment described above, the light detector 1 includes the dielectric layer 4 provided between the light detection substrate 2 and the meta-lens 30 (lens layer 3), but the dielectric layer 4 may be omitted.

As illustrated in FIG. 19, the light detector 1A of the third modification example is different from the light detector 1 (FIG. 7) of the above-described embodiment in that the dielectric layer 4 is not provided and the meta-lens 30 is directly disposed on the light incident surface 2a of the light detection substrate 2. In this case, the refractive index n of Equations (2) and (3) in the above-described embodiment is the refractive index of the semiconductor layer 11. Further, the focus point F and the effective focus point $F_{eff}$ in the above-described embodiment coincide with each other.

FIGS. 20A to 20C illustrate simulation results of a meta-lens phase pattern and light intensity distribution of a light detector according to the third modification example. In the third modification example, the width D of the meta-lens 30 is 15 μm, the width R of the opening region 30a is 10 μm, and the numerical aperture NA is set to 1.26. As shown in FIGS. 20B and 20C, also in the light detector 1A of the third modification example, it was confirmed that the light-condensing point $F_{ap}$ caused by opening diffraction by the opening region 30a is formed at a position closer to the light incident surface 2a than the focus point $F_{eff}$ based on the phase design of the meta-lens 30.

However, the intensity (contrast) of light at the light-condensing point $F_{ap}$ in the above-described embodiment (for example, first example) in which the dielectric layer 4 is provided is larger than the intensity of light at the light-condensing point $F_{ap}$ in the third modification example (FIG. 19). That is, it was confirmed that by forming the dielectric layer 4, the light condensing effect on the light-condensing point $F_{ap}$ formed at a position closer to the light incident surface 2a than the focus point $F_{eff}$ (focus point based on the phase design of the meta-lens) can be improved compared to a case where the dielectric layer is not provided.

Although some embodiments of the present disclosure have been described above, the present disclosure is not limited to the above-described embodiments. The material and shape of each component are not limited to those described above, and various materials and shapes may be employed. A part of the configuration in one embodiment or modification described above can be arbitrarily applied to the configuration in another embodiment or modification.

For example, the plurality of unit structures 31 (unit area U) may be arranged in a honeycomb grid pattern other than the square grid pattern. Further, the unit structure 31 is not limited to a columnar pillar. The unit structure 31 may be configured as a pillar (convex portion) having a shape other than a columnar shape (for example, a prismatic shape). In addition, the meta-lens 30 may employ a hole structure in which a plurality of holes (concave portions, unit structures) are periodically formed instead of the pillar structure in which a plurality of pillars (unit structures 31) are periodically formed as in the above-described embodiment. The hole structure is a structure obtained by inverting the pillar structure. For example, the hole structure has a shape in which a meta-lens material is formed in a portion where the pillar is not formed in the unit area U1 in the above-described embodiment, and a hole (concave portion) is formed in a portion corresponding to the pillar. When a meta-lens having a hole structure is used, the phase of the meta-lens can be designed by adjusting the width (hole diameter) of the hole in each unit area U1.

In the above-described embodiment, when viewed in the Z-axis direction, the entire opening region 30a overlaps the light receiving region LA and the opening region 30a is not provided outside the receiving region LA. However, the opening region 30a may be formed to be larger than the light receiving region LA, and the opening region 30a may exist outside the light receiving region 30a.

In addition, in a case where the light detection substrate 2 is configured as a SiPM having a plurality of light detection units 10 (SPAD) as in the embodiment described above, the light detection substrate 2 may have another configuration such as a configuration in which the N-type and the P-type are reversed. Further, the light detection substrate 2 may have a configuration other than the SiPM.

What is claimed is:

1. A light detector comprising:
a light detection substrate having at least one light receiving region and a light incident surface on which a detection target light is incident; and
a meta-lens configured by a plurality of unit structures arranged in a grid pattern and disposed on the light incident surface to focus the detection target light,
wherein when viewed in a thickness direction of the light detection substrate, an opening region in which the unit structure is not formed is provided in a region including a center of the meta-lens,
the meta-lens is formed such that a first distance is 40% or more and 90% or less of a second distance,
the second distance is a distance in the thickness direction from the meta-lens to a focus point set by the meta-lens, and
the first distance is a distance in the thickness direction from the meta-lens to a light-condensing point formed at a position closer to the light incident surface than the focus point due to the opening region being provided.

2. The light detector according to claim 1, further comprising:
a dielectric layer disposed between the light detection substrate and the meta-lens, and having a refractive index lower than that of the light detection substrate.

3. The light detector according to claim 1, wherein
a numerical aperture NA of the meta-lens is set so as to satisfy the following Equation (1), and
in the Equation (1), $\lambda_{eff}$ is an effective wavelength of the detection target light passing through the meta-lens, and P is a period in which the plurality of unit structures are arranged $$\frac{\lambda_{eff}}{4*P} < NA < \frac{\lambda_{eff}}{2*P}. \tag{1}$$

4. The light detector according to claim 1, wherein when viewed in the thickness direction, the opening region has a rectangular shape.

5. The light detector according to claim 1, wherein the plurality of unit structures are configured such that a phase distribution of the meta-lens follows a quadratic phase pattern.

6. The light detector according to claim 1, wherein the light detection substrate includes an avalanche photodiode.

7. The light detector according to claim 1, wherein when viewed in the thickness direction, the meta-lens is formed to overlap both an adjacent region adjacent to the light receiving region and a peripheral region inside of the light receiving region along a boundary between the light receiving region and the adjacent region.

8. The light detector according to claim 1, wherein the meta-lens is formed such that the first distance is not less than 50% and not more than 80% of the second distance.

9. The light detector according to claim 1, wherein when viewed in the thickness direction, a width of the opening region is equal to or greater than a half of a width of the meta-lens.

\* \* \* \* \*